(12) United States Patent
Kawashima et al.

(10) Patent No.: US 11,204,533 B2
(45) Date of Patent: Dec. 21, 2021

(54) DISPLAY DEVICE AND ELECTRONIC DEVICE

(71) Applicant: SEMICONDUCTOR ENERGY LABORATORY CO., LTD., Atsugi (JP)

(72) Inventors: Susumu Kawashima, Kanagawa (JP); Naoto Kusumoto, Kanagawa (JP)

(73) Assignee: Semiconductor Energy Laboratory Co., Ltd., Atsugi (JP)

(*) Notice: Subject to any disclaimer, the term of this patent is extended or adjusted under 35 U.S.C. 154(b) by 0 days.

(21) Appl. No.: 16/977,937

(22) PCT Filed: Feb. 26, 2019

(86) PCT No.: PCT/IB2019/051513
§ 371 (c)(1),
(2) Date: Sep. 3, 2020

(87) PCT Pub. No.: WO2019/171204
PCT Pub. Date: Sep. 12, 2019

(65) Prior Publication Data
US 2021/0011347 A1 Jan. 14, 2021

(30) Foreign Application Priority Data
Mar. 6, 2018 (JP) .............................. JP2018-039185

(51) Int. Cl.
*G02F 1/1362* (2006.01)
*G02F 1/1333* (2006.01)
(Continued)

(52) U.S. Cl.
CPC .... *G02F 1/136286* (2013.01); *G02F 1/13338* (2013.01); *G09G 3/3208* (2013.01);
(Continued)

(58) Field of Classification Search
CPC ........... G02F 1/136286; G02F 1/13338; G02F 1/133; H01L 27/3234; H01L 27/3262;
(Continued)

(56) References Cited

U.S. PATENT DOCUMENTS 6,107,980 A   8/2000  Hermanns et al.
6,703,993 B2  3/2004  Miura et al.
(Continued)

FOREIGN PATENT DOCUMENTS

CN   101446723 A   6/2009
CN   102737586 A   10/2012
(Continued)

OTHER PUBLICATIONS

International Search Report (Application No. PCT/IB2019/051513) dated May 28, 2019.
(Continued)

*Primary Examiner* — Donald L Raleigh
(74) *Attorney, Agent, or Firm* — Fish & Richardson P.C.

(57) ABSTRACT

A display device capable of improving the image quality is provided. The display device includes a pixel in which a first node, a second node, a third node, and a display element are provided, and the same image data is written to the first node and the second node first. Then, at the same time when the image data is read from the second node to the third node, the image data is added to the image data in the first node by capacitive coupling. This operation enables a data potential higher than or equal to the output voltage of a source driver to be supplied to the display element.

9 Claims, 23 Drawing Sheets

(51) Int. Cl.
*H01L 27/32* (2006.01)
*G09G 3/3208* (2016.01)
*G09G 3/36* (2006.01)

(52) U.S. Cl.
CPC ....... *G09G 3/3648* (2013.01); *H01L 27/3234* (2013.01); *H01L 27/3262* (2013.01); *H01L 27/3265* (2013.01); *H01L 27/3276* (2013.01)

(58) Field of Classification Search
CPC ............. H01L 27/3265; H01L 27/3276; H01L 27/3225; H01L 51/50; H01L 27/326; G09F 9/30; G09G 3/20; G09G 3/3233; G09G 3/36; H05B 33/12

See application file for complete search history.

(56) References Cited

U.S. PATENT DOCUMENTS

| | | | |
|---|---|---|---|
| 6,724,359 | B2 | 4/2004 | Yamamoto et al. |
| 7,808,566 | B2 | 10/2010 | Honda |
| 7,995,155 | B2 | 8/2011 | Yang et al. |
| 8,054,393 | B2 | 11/2011 | Takahashi |
| 8,976,090 | B2 | 3/2015 | Yamamoto et al. |
| 9,134,581 | B2 | 9/2015 | Yang et al. |
| 9,916,791 | B2 | 3/2018 | Kimura et al. |
| 10,140,940 | B2 | 11/2018 | Aoki |
| 10,176,754 | B2 | 1/2019 | Kasai |
| 2002/0000962 | A1 | 1/2002 | Miura et al. |
| 2002/0089813 | A1 | 7/2002 | Yamamoto et al. |
| 2002/0149553 | A1 | 10/2002 | Tsujimura et al. |
| 2007/0072439 | A1 | 3/2007 | Akimoto et al. |
| 2009/0073334 | A1 | 3/2009 | Honda |
| 2009/0109360 | A1 | 4/2009 | Takahashi |
| 2009/0135323 | A1 | 5/2009 | Yang et al. |
| 2012/0223978 | A1 | 9/2012 | Yamamoto et al. |
| 2012/0249509 | A1 | 10/2012 | Kim et al. |
| 2016/0307518 | A1 | 10/2016 | Kimura et al. |
| 2017/0025080 | A1 | 1/2017 | Aoki |
| 2017/0221415 | A1 | 8/2017 | Kasai |
| 2020/0193928 | A1 | 6/2020 | Kawashima et al. |
| 2020/0278398 | A1 | 9/2020 | Isa et al. |
| 2020/0287414 | A1 | 9/2020 | Kusunoki et al. |
| 2020/0357354 | A1 | 11/2020 | Kawashima et al. |

FOREIGN PATENT DOCUMENTS

| | | |
|---|---|---|
| CN | 107016958 A | 8/2017 |
| EP | 2506247 A | 10/2012 |
| JP | 2001-281634 A | 10/2001 |
| JP | 2002-277898 A | 9/2002 |
| JP | 2007-096055 A | 4/2007 |
| JP | 2009-037230 A | 2/2009 |
| JP | 2009-109600 A | 5/2009 |
| JP | 2009-128900 A | 6/2009 |
| JP | 2011-119674 A | 6/2011 |
| JP | 2011-145447 A | 7/2011 |
| JP | 2011-150009 A | 8/2011 |
| JP | 2011-150010 A | 8/2011 |
| JP | 2012-145655 A | 8/2012 |
| JP | 2012-168226 A | 9/2012 |
| JP | 2016-206659 A | 12/2016 |
| JP | 2017-027012 A | 2/2017 |
| JP | 2017-134240 A | 8/2017 |
| KR | 2009-0054300 A | 5/2009 |
| KR | 2012-0110387 A | 10/2012 |
| TW | 201737228 | 10/2017 |

OTHER PUBLICATIONS

Written Opinion (Application No. PCT/IB2019/051513) dated May 28, 2019.

Amano.S et al., "Low Power LC Display Using In—Ga—Zn-Oxide TFTs Based on Variable Frame Frequency", SID Digest '10 : SID International Symposium Digest of Technical Papers, May 23, 2010, vol. 41, No. 1, pp. 626-629.

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.

Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics) , 2012, vol. 51, pp. 021201-1-021201-7.

Yamazaki.S et al., "Properties of crystalline In—Ga—Zn-oxide semiconductor and its transistor characteristics", Jpn. J. Appl. Phys. (Japanese Journal of Applied Physics) , Mar. 31, 2014, vol. 53, No. 4S, pp. 04ED18-1-04ED18-10.

YAMAZAKI.S et al., "In—Ga—Zn-Oxide Semiconductor and Its Transistor Characteristics", Ecs Journal of Solid State Science and Technology, Jul. 1, 2014, vol. 3, No. 9, pp. Q3012-Q3022.

Yamazaki.S, "Crystalline Oxide Semiconductor Using CAAC-IGZO and its Application", ECS Transactions, Oct. 1, 2014, vol. 64, No. 10, pp. 155-164, The Electrochemical Society.

Matsuda.S et al., "30-nm-Channel-Length C-Axis Aligned Crystalline In—Ga—Zn—O Transistors with Low Off-State Leakage Current and Steep Subthreshold Characteristics", 2015 Symposium on VLSI Technology : Digest of Technical Papers, 2015, pp. T216-T217.

Ito.S et al., "Analysis of Nanoscale Crystalline Structure of In—Ga—Zn—O Thin Film with Nano Beam Electron Diffraction", AM-FPD '13 Digest of Technical Papers, Jul. 2, 2013, pp. 151-154.

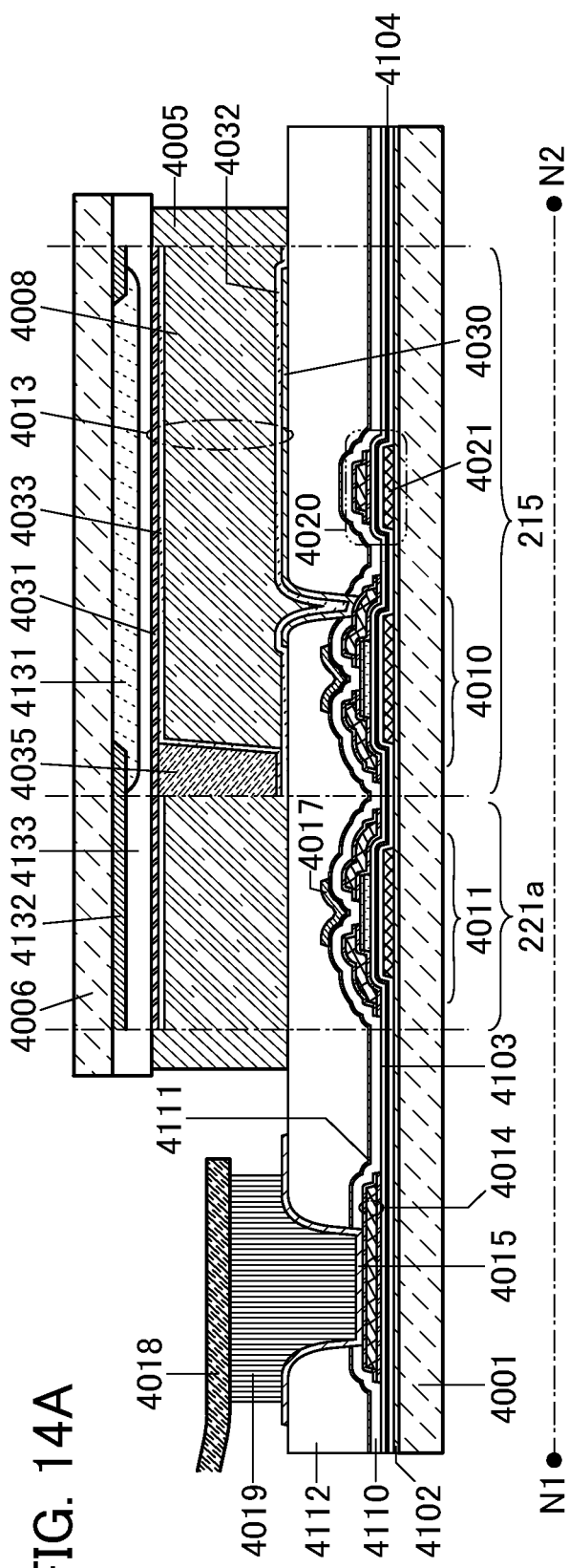
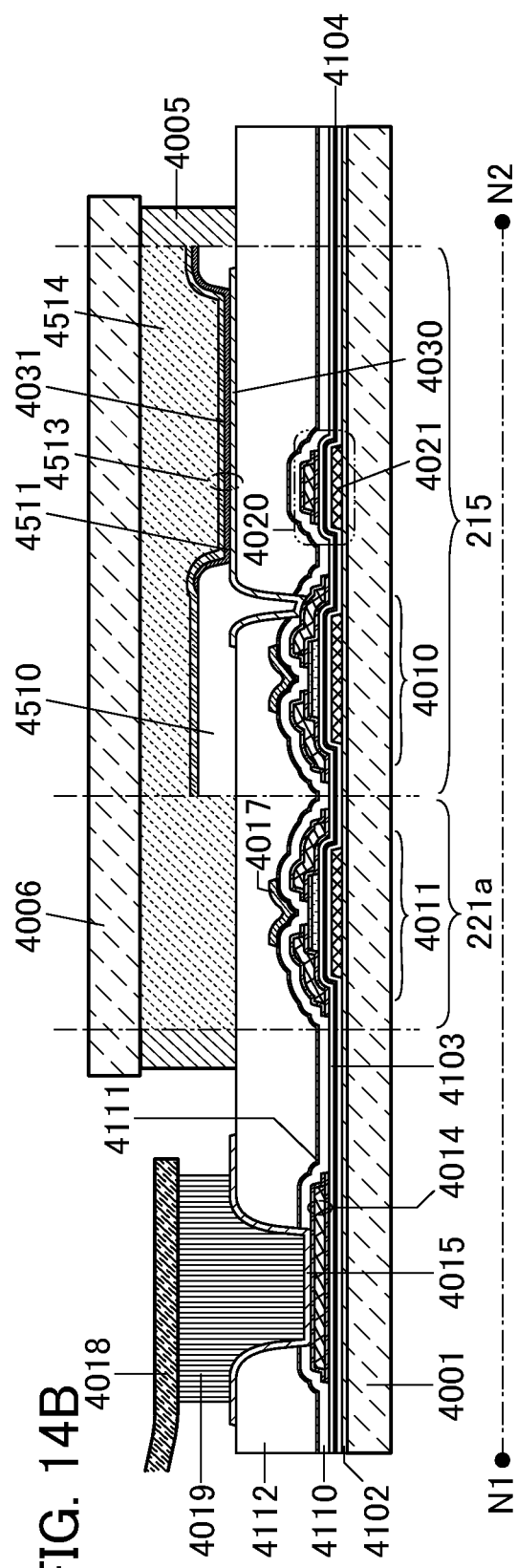
FIG. 14A
FIG. 14B

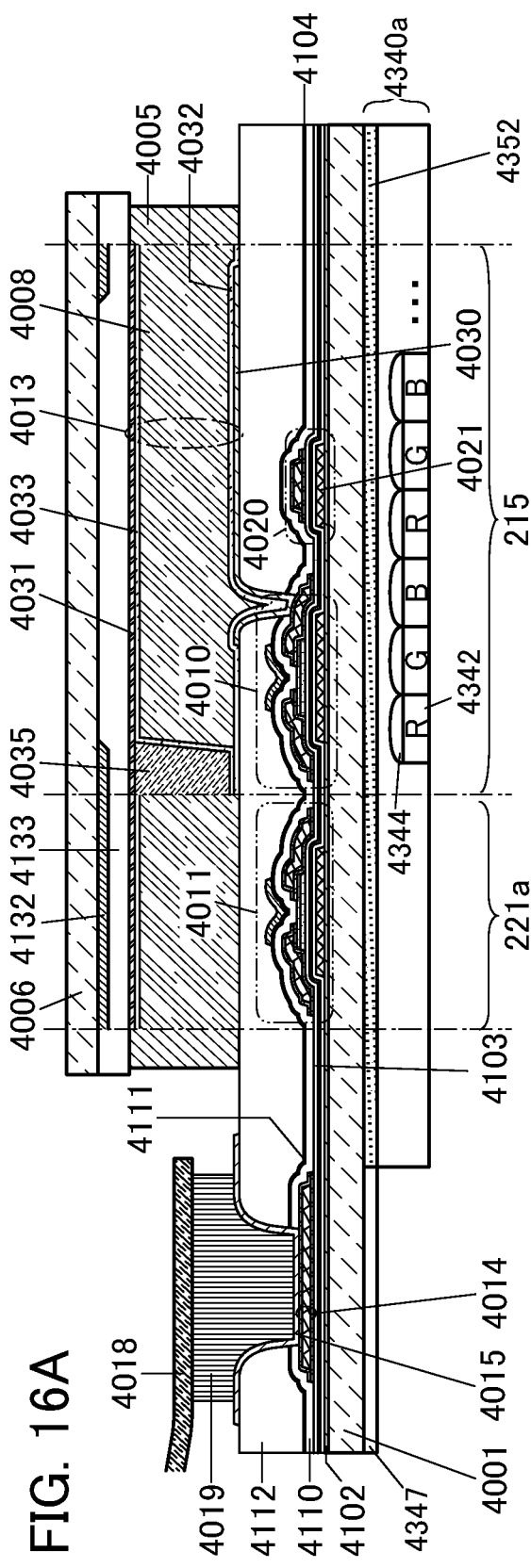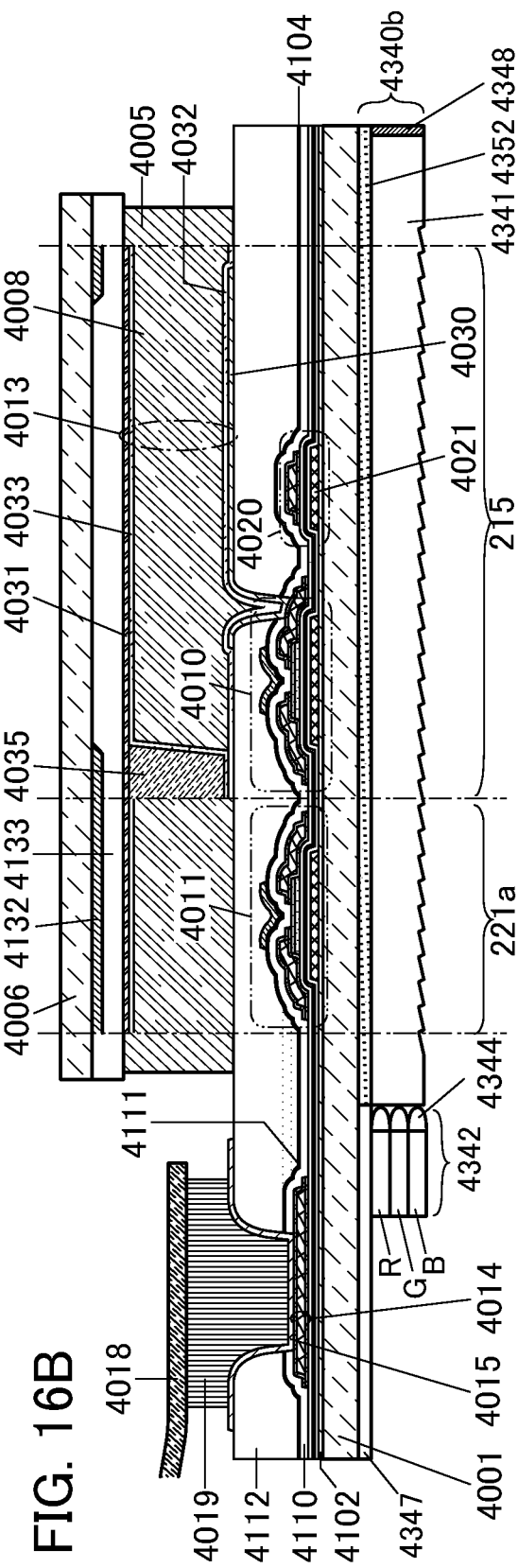
FIG. 16A
FIG. 16B

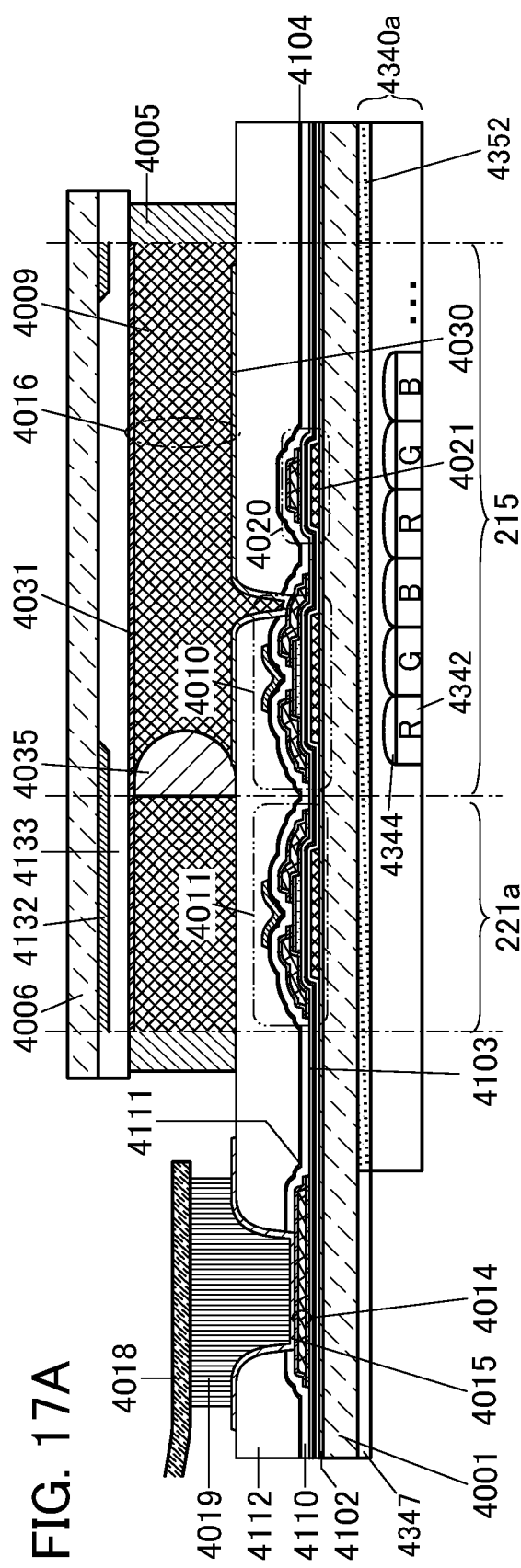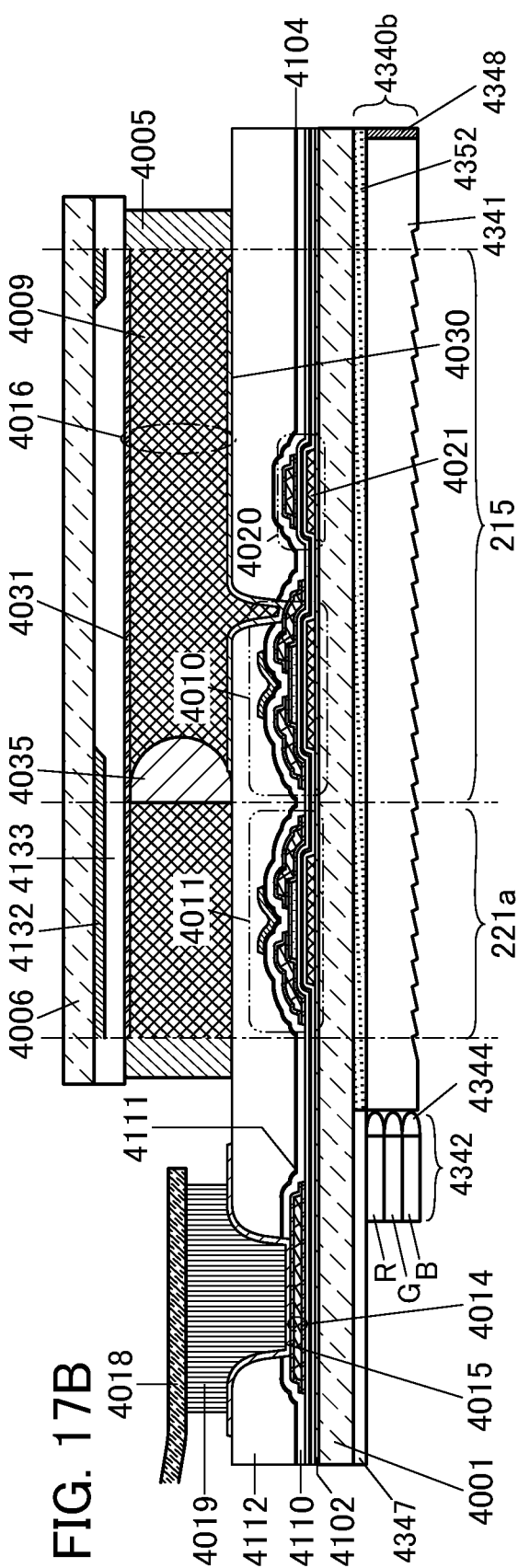

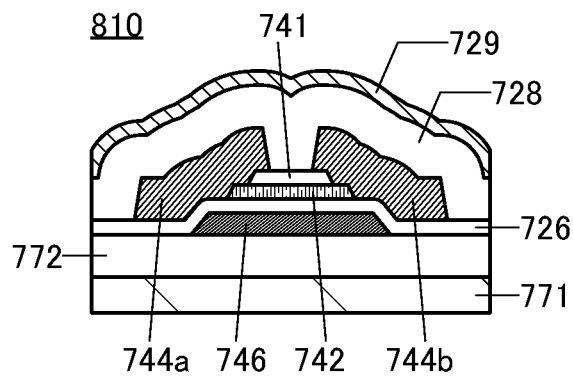
FIG. 19A1
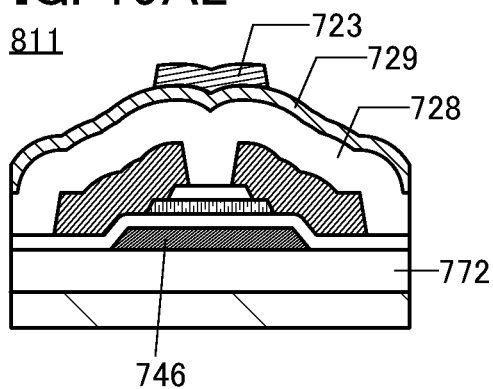
FIG. 19A2
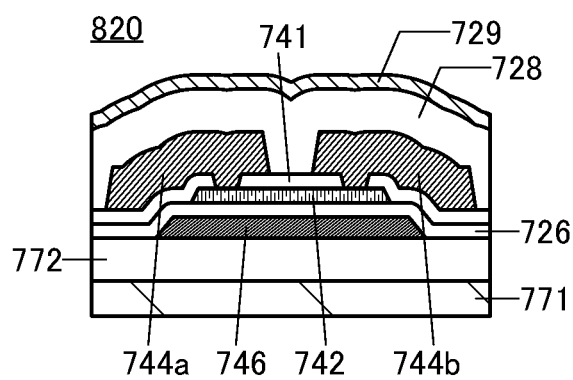
FIG. 19B1
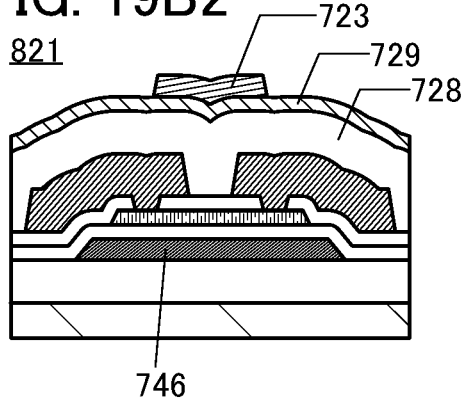
FIG. 19B2
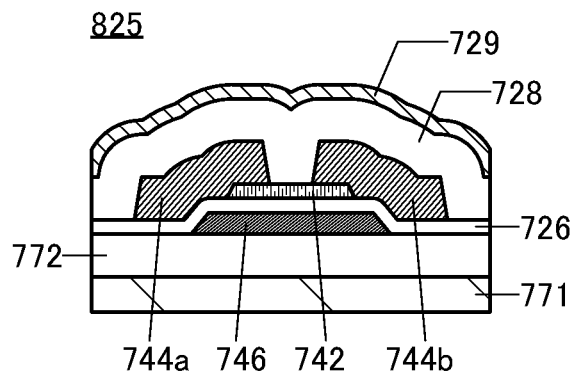
FIG. 19C1
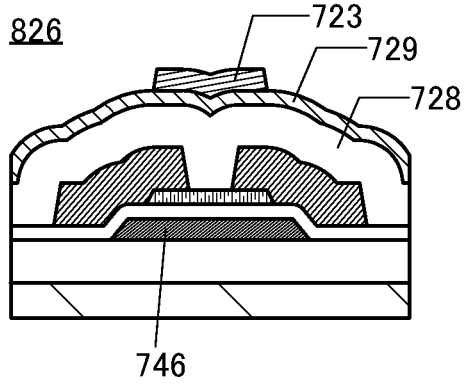
FIG. 19C2

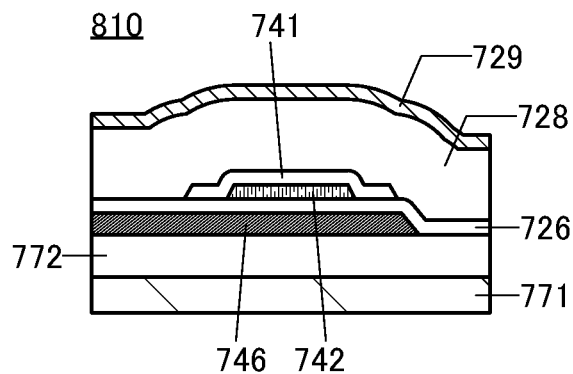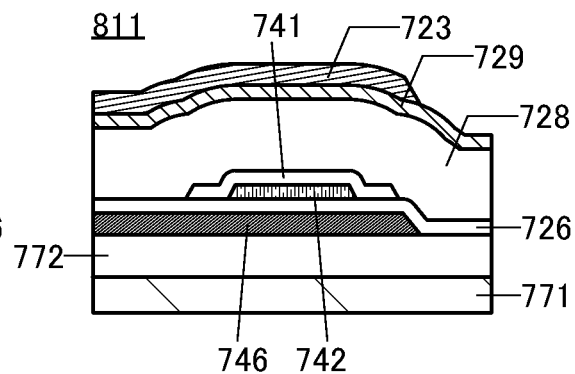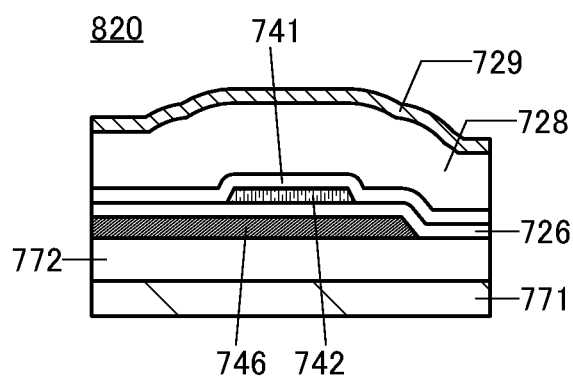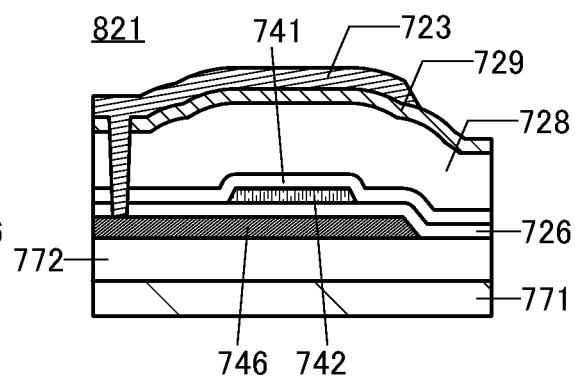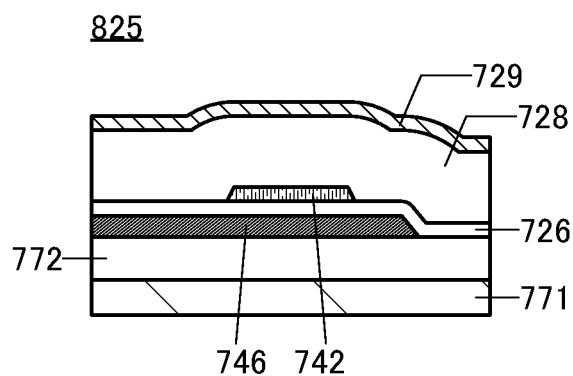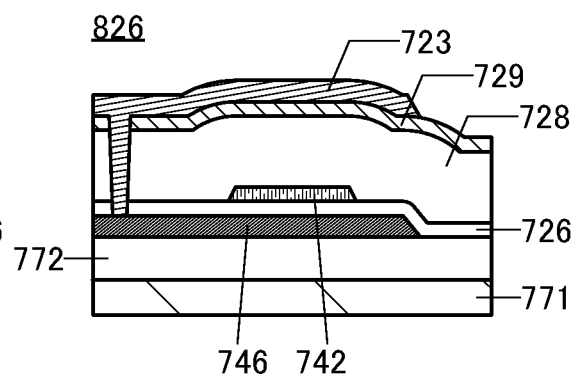

FIG. 21A1
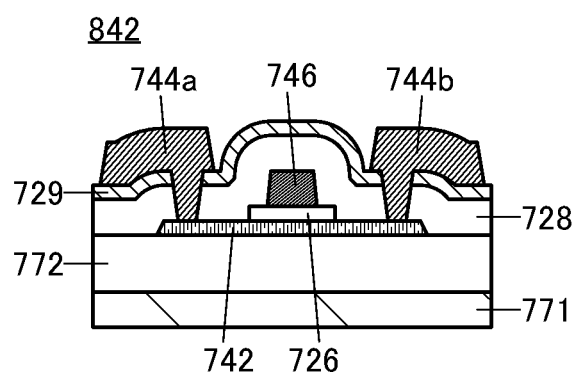
FIG. 21A2
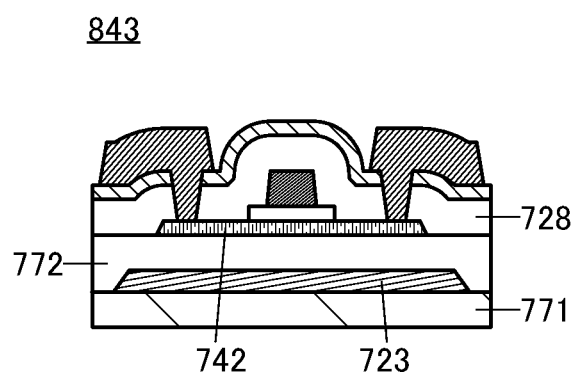
FIG. 21B1
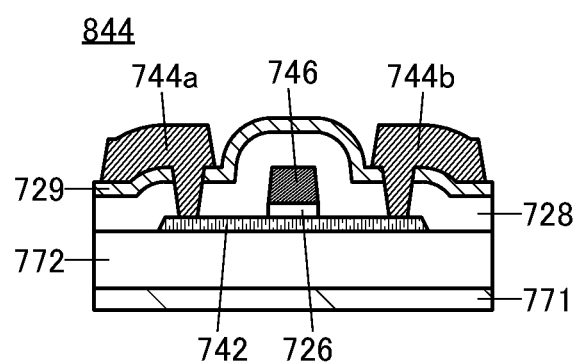
FIG. 21B2
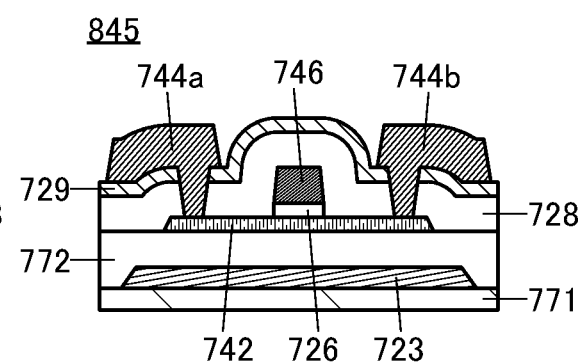
FIG. 21C1
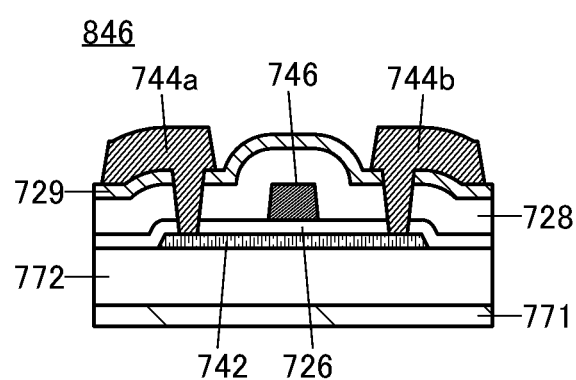
FIG. 21C2
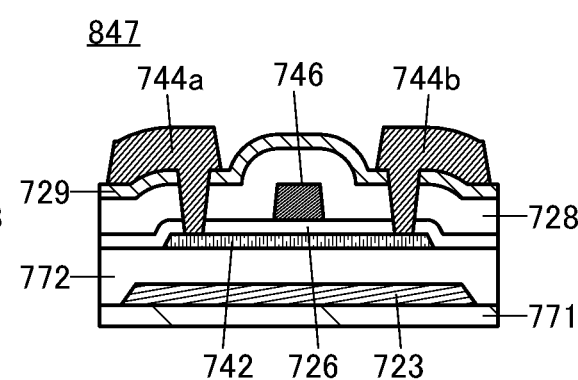

FIG. 22A1
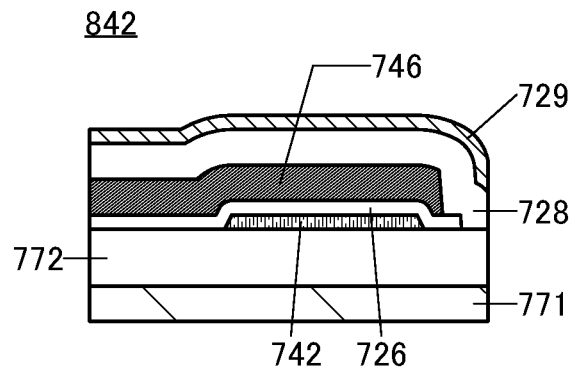
FIG. 22A2
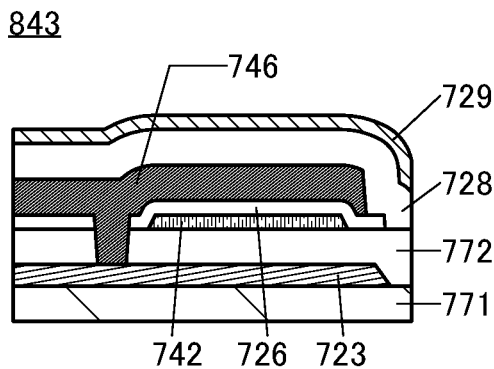
FIG. 22B1
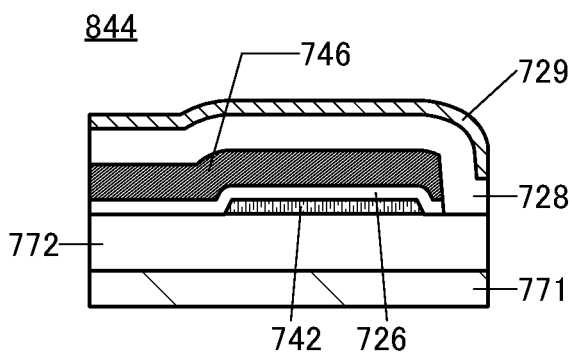
FIG. 22B2
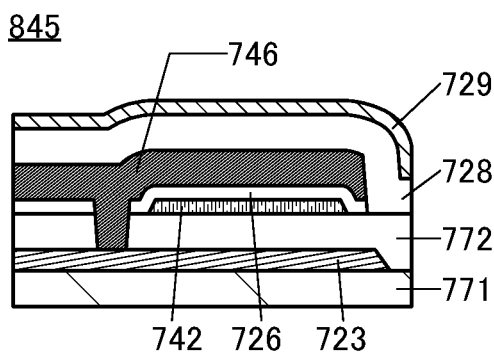
FIG. 22C1
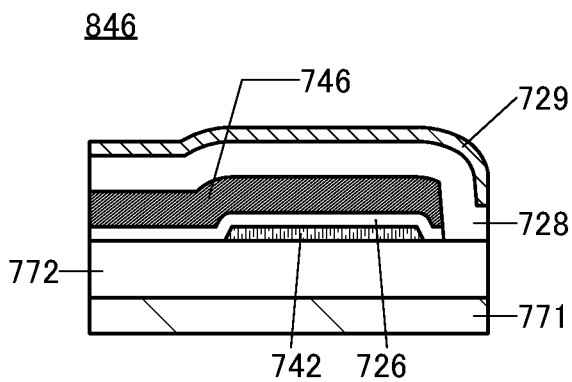
FIG. 22C2
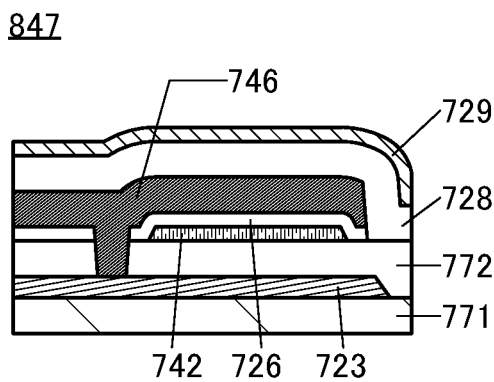

DISPLAY DEVICE AND ELECTRONIC DEVICE

CROSS REFERENCE TO RELATED APPLICATIONS

This application is a U.S. National Phase Application under 35 U.S.C. § 371 of International Application PCT/IB2019/051513, filed on Feb. 26, 2019, which is incorporated by reference and claims the benefit of a foreign priority application filed in Japan on Mar. 6, 2018, as Application No. 2018-039185.

TECHNICAL FIELD

One embodiment of the present invention relates to a display device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition (composition of matter). Specifically, examples of the technical field of one embodiment of the present invention disclosed in this specification include a semiconductor device, a display device, a liquid crystal display device, a light-emitting device, a lighting device, a power storage device, a memory device, an imaging device, a driving method thereof, and a manufacturing method thereof.

In this specification and the like, a semiconductor device generally means a device that can function by utilizing semiconductor characteristics. A transistor and a semiconductor circuit are embodiments of semiconductor devices. In some cases, a memory device, a display device, an imaging device, or an electronic device includes a semiconductor device.

BACKGROUND ART

A silicon-based semiconductor material is widely known as a semiconductor thin film that can be used in a transistor; in addition, an oxide semiconductor has been attracting attention as another material. As the oxide semiconductor, not only single-component metal oxides, such as indium oxide and zinc oxide, but also multi-component metal oxides are known. Among the multi-component metal oxides, an In—Ga—Zn oxide (hereinafter also referred to as IGZO), in particular, has been actively studied.

Through the studies on IGZO, a CAAC (c-axis aligned crystalline) structure and an nc (nanocrystalline) structure, which are not single crystal nor amorphous, have been found in an oxide semiconductor (see Non-Patent Document 1 to Non-Patent Document 3). Non-Patent Document 1 and Non-Patent Document 2 also disclose a technique for manufacturing a transistor using an oxide semiconductor having a CAAC structure. Moreover, Non-Patent Document 4 and Non-Patent Document 5 disclose that a fine crystal is included even in an oxide semiconductor which has lower crystallinity than the CAAC structure and the nc structure.

In addition, a transistor that uses IGZO for an active layer has an extremely low off-state current (see Non-Patent Document 6), and an LSI and a display utilizing the characteristics have been reported (see Non-Patent Document 7 and Non-Patent Document 8).

Patent Document 1 discloses a memory device using a transistor with an extremely low off-state current in a memory cell.

REFERENCE

Patent Document

[Patent Document 1] Japanese Published Patent Application No. 2011-119674

Non-Patent Document

[Non-Patent Document 1] S. Yamazaki et al., "SID Symposium Digest of Technical Papers", 2012, volume 43, issue 1, pp. 183-186.
[Non-Patent Document 2] S. Yamazaki et al., "Japanese Journal of Applied Physics", 2014, volume 53, Number 4S, pp. 04ED18-1-04ED18-10.
[Non-Patent Document 3] S. Ito et al., "The Proceedings of AM-FPD'13 Digest of Technical Papers", 2013, pp. 151-154.
[Non-Patent Document 4] S. Yamazaki et al., "ECS Journal of Solid State Science and Technology", 2014, volume 3, issue 9, pp. Q3012-Q3022.
[Non-Patent Document 5] S. Yamazaki, "ECS Transactions", 2014, volume 64, issue 10, pp. 155-164.
[Non-Patent Document 6] K. Kato et al., "Japanese Journal of Applied Physics", 2012, volume 51, pp. 021201-1-021201-7.
[Non-Patent Document 7] S. Matsuda et al., "2015 Symposium on VLSI Technology Digest of Technical Papers", 2015, pp. T216-T217.
[Non-Patent Document 8] S. Amano et al., "SID Symposium Digest of Technical Papers", 2010, volume 41, issue 1, pp. 626-629.

SUMMARY OF THE INVENTION

Problems to be Solved by the Invention

The resolution of display devices has been increased; hardware capable of displaying images of an 8K4K (pixel number: 7680×4320) or higher resolution has been developed. In addition, the HDR (high dynamic range) display technique, which increases image quality by luminance adjustment, has been introduced.

To perform clear gradation display, the width of data potentials that can be supplied to a display element is desired to be wide. Meanwhile, the output voltage of a source driver for a liquid crystal display device is approximately 15 V, for example, and supplying a higher voltage to the display element requires a high output source driver to be used. A high output source driver consumes high power, and requires a new driver IC to be developed in some cases.

Moreover, displaying a moving image more smoothly requires the frame frequency to be increased; however, since the increase in the number of pixels shortens a horizontal period, increasing the frame frequency is difficult. Achieving a structure where the frame frequency is easily increased makes the application to a field-sequential liquid crystal display device or the like easier.

Thus, an object of one embodiment of the present invention is to provide a display device capable of improving image quality. Another object is to provide a display device capable of supplying voltage higher than or equal to the output voltage of a source driver to a display element.

Another object is to provide a display device capable of enhancing the luminance of a displayed image. Another object is to provide a display device capable of increasing the frame frequency.

Another object is to provide a low-power display device. Another object is to provide a highly reliable display device. Another object is to provide a novel display device or the like. Another object is to provide a method for driving any of the above display devices. Another object is to provide a novel semiconductor device or the like.

Note that the descriptions of these objects do not preclude the existence of other objects. One embodiment of the present invention does not have to achieve all the objects. Other objects will be apparent from and can be derived from the description of the specification, the drawings, the claims, and the like.

Means for Solving the Problems

One embodiment of the present invention relates to a display device capable of improving image quality.

One embodiment of the present invention is a display device including a pixel in which a first node, a second node, a third node, and a display element are provided, a function of writing first data to the first node and the second node, a function of reading the first data held in the second node to the third node, a function of generating second data in the first node by capacitive coupling between the first data held in the first node and the first data read out to the third node, and a function of supplying the second data to the display element to perform display.

Another embodiment of the present invention is a display device including a first pixel, a second pixel, a first wiring, and a second wiring, the first pixel and the second pixel each provided with a first node, a second node, a third node, and a display element, the first wiring electrically connected to the first pixel, the second wiring electrically connected to the first pixel, and the second wiring electrically connected to the second pixel. A first function of writing first data to the first node and the second node, a second function of reading the first data held in the second node to the third node, a third function of generating second data in the first node by capacitive coupling between the first data held in the first node and the first data read out to the third node, and a fourth function of supplying the second data to the display element to perform display are also included. The first function works in the first pixel when a first signal is supplied to the first wiring, and the second to fourth functions work in the first pixel and the first function works in the second pixel when a second signal is supplied to the second wiring.

Another embodiment of the present invention is a display device including a first pixel, a second pixel, a first wiring, a second wiring, a third wiring, and a fourth wiring; the first pixel and the second pixel include a first transistor, a second transistor, a third transistor, a fourth transistor, a first capacitor, a second capacitor, and a circuit block; one of a source and a drain of the first transistor is electrically connected to one electrode of the first capacitor; the one electrode of the first capacitor is electrically connected to one of a source and a drain of the second transistor; the other of the source and the drain of the second transistor is electrically connected to one of a source and a drain of the third transistor; the one of the source and the drain of the third transistor is electrically connected to one electrode of the second capacitor; the other electrode of the second capacitor is electrically connected to one of a source and a drain of the fourth transistor; the one of the source and the drain of the fourth transistor is electrically connected to the circuit block. In the first pixel, the other of the source and the drain of the first transistor is electrically connected to the first wiring, the other of the source and the drain of the fourth transistor is electrically connected to the first wiring, a gate of the first transistor is electrically connected to the second wiring, a gate of the second transistor is electrically connected to the third wiring, a gate of the third transistor is electrically connected to the second wiring, and a gate of the fourth transistor is electrically connected to the second wiring. In the second pixel, the other of the source and the drain of the first transistor is electrically connected to the first wiring, the other of the source and the drain of the fourth transistor is electrically connected to the first wiring, the gate of the first transistor is electrically connected to the third wiring, the gate of the second transistor is electrically connected to the fourth wiring, the gate of the third transistor is electrically connected to the third wiring, and the gate of the fourth transistor is electrically connected to the third wiring. The circuit block includes a display element.

The circuit block may include a fifth transistor, a sixth transistor, a third capacitor, and an organic EL element as the display element; one electrode of the organic EL element may be electrically connected to one of a source and a drain of the sixth transistor; the other of the source and the drain of the sixth transistor may be electrically connected to one electrode of the third capacitor; the one electrode of the third capacitor may be electrically connected to one of a source and a drain of the fifth transistor; a gate of the fifth transistor may be electrically connected to the other electrode of the third capacitor; and the other electrode of the third capacitor may be electrically connected to the one electrode of the second capacitor.

In the above structure, the other of the source and the drain of the fifth transistor may be electrically connected to the other of the source and the drain of the third transistor.

The circuit block may include a seventh transistor, a fourth capacitor, and a liquid crystal element as the display element; one electrode of the liquid crystal element may be electrically connected to one electrode of the fourth capacitor; the one electrode of the fourth capacitor may be electrically connected to one of a source and a drain of the seventh transistor; and the other of the source and the drain of the seventh transistor may be electrically connected to the one electrode of the second capacitor.

In the above structure, the other electrode of the fourth capacitor may be electrically connected to the other of the source and the drain of the third transistor.

It is preferable that the fourth transistor include a metal oxide in a channel formation region and that the metal oxide includes In, Zn, and M (M is Al, Ti, Ga, Sn, Y, Zr, La, Ce, Nd, or Hf).

Effect of the Invention

With the use of one embodiment of the present invention, a display device capable of improving image quality can be provided. Alternatively, a display device capable of supplying voltage higher than or equal to the output voltage of a source driver to a display element can be provided. Alternatively, a display device capable of enhancing the luminance of a displayed image can be provided. Alternatively, a display device capable of increasing the frame frequency can be provided.

Alternatively, a low-power display device can be provided. Alternatively, a highly reliable display device can be provided. Alternatively, a novel display device or the like can be provided. Alternatively, a method for driving any of the above display devices can be provided.

Alternatively, a novel semiconductor device or the like can be provided.

BRIEF DESCRIPTION OF THE DRAWINGS

FIGS. 14A and 14B Diagrams each illustrating a display device.
FIGS. 16A and 16B Diagrams each illustrating a display device.
FIGS. 17A and 17B Diagrams each illustrating a display device.
FIGS. 19A1, 19A2, 19B1, 19B2, 19C1, and 19C2 Diagrams each illustrating a transistor.
FIGS. 20A1, 20A2, 20B1, 20B2, 20C1, and 20C2 Diagrams each illustrating a transistor.
FIGS. 21A1, 21A2, 21B1, 21B2, 21C1, and 21C2 Diagrams each illustrating a transistor.
FIGS. 22A1, 22A2, 22B1, 22B2, 22C1, and 22C2 Diagrams each illustrating a transistor.

MODE FOR CARRYING OUT THE INVENTION

Figure 1:
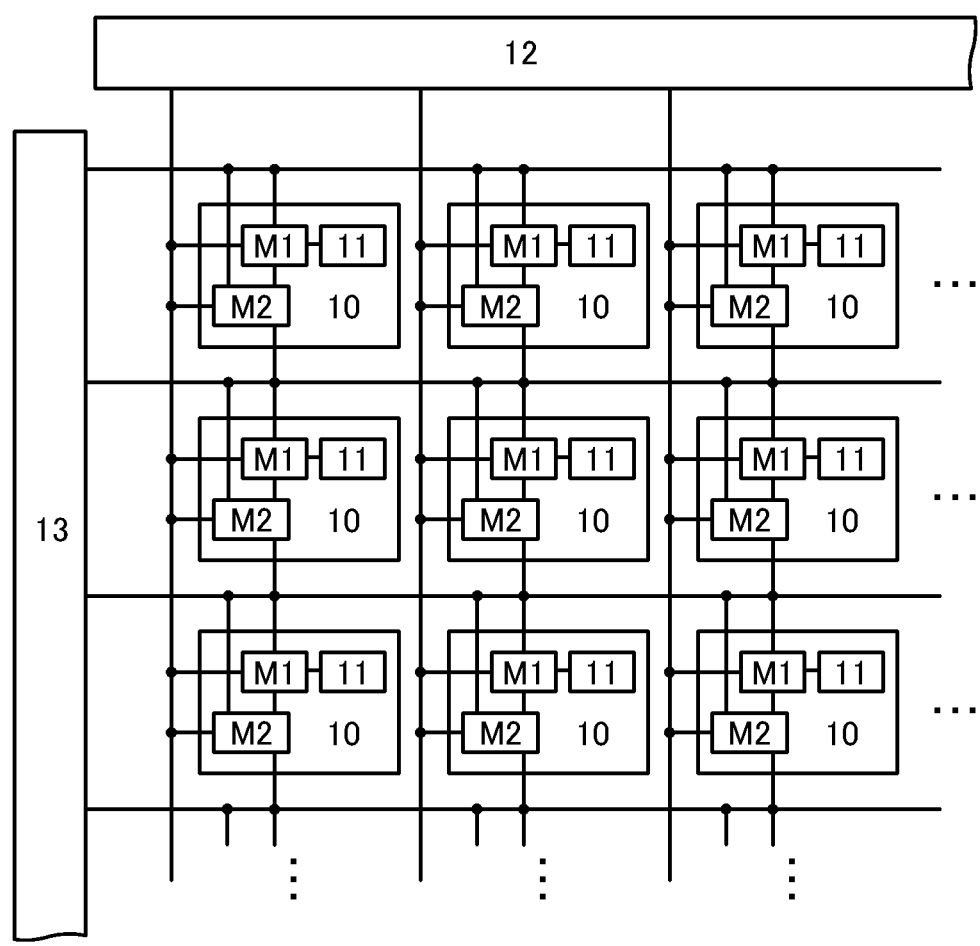
FIG. 1 A diagram illustrating a display device.

Embodiments will be described in detail with reference to the drawings. Note that the present invention is not limited to the following description and it will be readily appreciated by those skilled in the art that modes and details can be modified in various ways without departing from the spirit and the scope of the present invention. Thus, the present invention should not be interpreted as being limited to the description of embodiments below. Note that in structures of the invention described below, the same portions or portions having similar functions are denoted by the same reference numerals in different drawings, and the description thereof is not repeated in some cases. The same components are denoted by different hatching patterns in different drawings, or the hatching patterns are omitted in some cases.

Even in the case where a single component is illustrated in a circuit diagram, the component may be composed of a plurality of parts as long as there is no functional inconvenience. For example, in some cases, a plurality of transistors that operate as a switch are connected in series or in parallel. In some cases, capacitors are divided and arranged in a plurality of positions.

One conductor has a plurality of functions such as a wiring, an electrode, and a terminal in some cases; in this specification, a plurality of names are used for the same component in some cases. Even in the case where elements are illustrated in a circuit diagram as if they were directly connected to each other, the elements may actually be connected to each other through a plurality of conductors; in this specification, even such a configuration is included in direct connection.

Embodiment 1

In this embodiment, a display device of one embodiment of the present invention will be described with reference to drawings.

One embodiment of the present invention is a display device having a function of adding up image data in pixels. The display device has a structure in which the same image data is written to each of the two nodes in the pixel and then the image data is added up. Since the timing of writing the image data and the timing of the addition operation are different, pixels in the vertical direction (direction in which a source line extends) can share a gate line and perform parallel operations. Thus, the number of source lines connected to one pixel can be one. In addition, the number of gate lines connected to one pixel can also be practically one.

Each pixel is provided with a plurality of nodes, and the same image data is written to a first node and a second node first. Then, at the same time when the image data is read from the second node to a third node, the image data is added to the image data in the first node by capacitive coupling. Through this operation, a data potential which is higher than or equal to the output voltage of a source driver can be supplied to the display element.

In addition, an operation of reading the image data from the second node to the third node in a first pixel and an operation of retaining the same image data in a first node and a second node in a second pixel can be performed in parallel, which enables high-speed operation.

FIG. 1 is a diagram illustrating a display device of one embodiment of the present invention. The display device includes a pixel 10, a source driver 12, and a gate driver 13. Note that two or more source drivers 12 and/or two or more gate drivers 13 may be provided to drive the pixel 10.

The pixel 10 includes a memory unit M1, a memory unit M2, and a display element 11. The memory unit M1 is electrically connected to the display element 11. The memory unit M2 is electrically connected to the memory unit M1.

The memory unit M1 and the memory unit M2 are electrically connected to a source line and a first gate line, and a signal supplied to the first gate line results in the same data being written to the memory unit M1 and the memory unit M2. Accordingly, the memory unit M1 and the memory unit M2 can retain the same data supplied from the source line. In addition, the memory unit M2 is electrically connected to a second gate line, and a signal supplied to the second gate line results in data being read.

The data read from the memory unit M2 is added to the data of the memory unit M1, and the added-up data is supplied to the display element 11. By such operation, a voltage higher than or equal to the output voltage of the source driver 12 can be supplied to the display element 11.

As described above, a single pixel 10 is electrically connected to two gate lines, and the timing of writing data to the memory unit M1 and the memory unit M2 and the timing of reading data from the memory unit M2 are controlled to be different from each other within the same pixel.

Here, the timing of reading data from the memory unit M2 in the pixel 10 in the n-th row (n is a natural number greater than or equal to 1) and the timing of writing data to the memory unit M1 and the memory unit M2 in the pixel 10 in the (n+1)-th row can be overlapped. Thus, one gate line can be shared by the pixel 10 in the n-th row and the pixel 10 in the (n+1)-th row.

In the above structure, the number of gate lines to be electrically connected to the pixel 10 in the first row or the last row is calculated to be 1.5 (1+0.5), and the number of gate lines to be electrically connected to each of the other pixels 10 is calculated to be 1 (0.5+0.5). That is, one pixel 10 can be controlled by practically one gate line; thus, high-speed operation is possible even when an operation of adding up data is included. Furthermore, a gate driver that requires complicated control is not necessary. Moreover, the number of gate lines is reduced, so that the aperture ratio of the pixel 10 can be increased.

Figure 2:
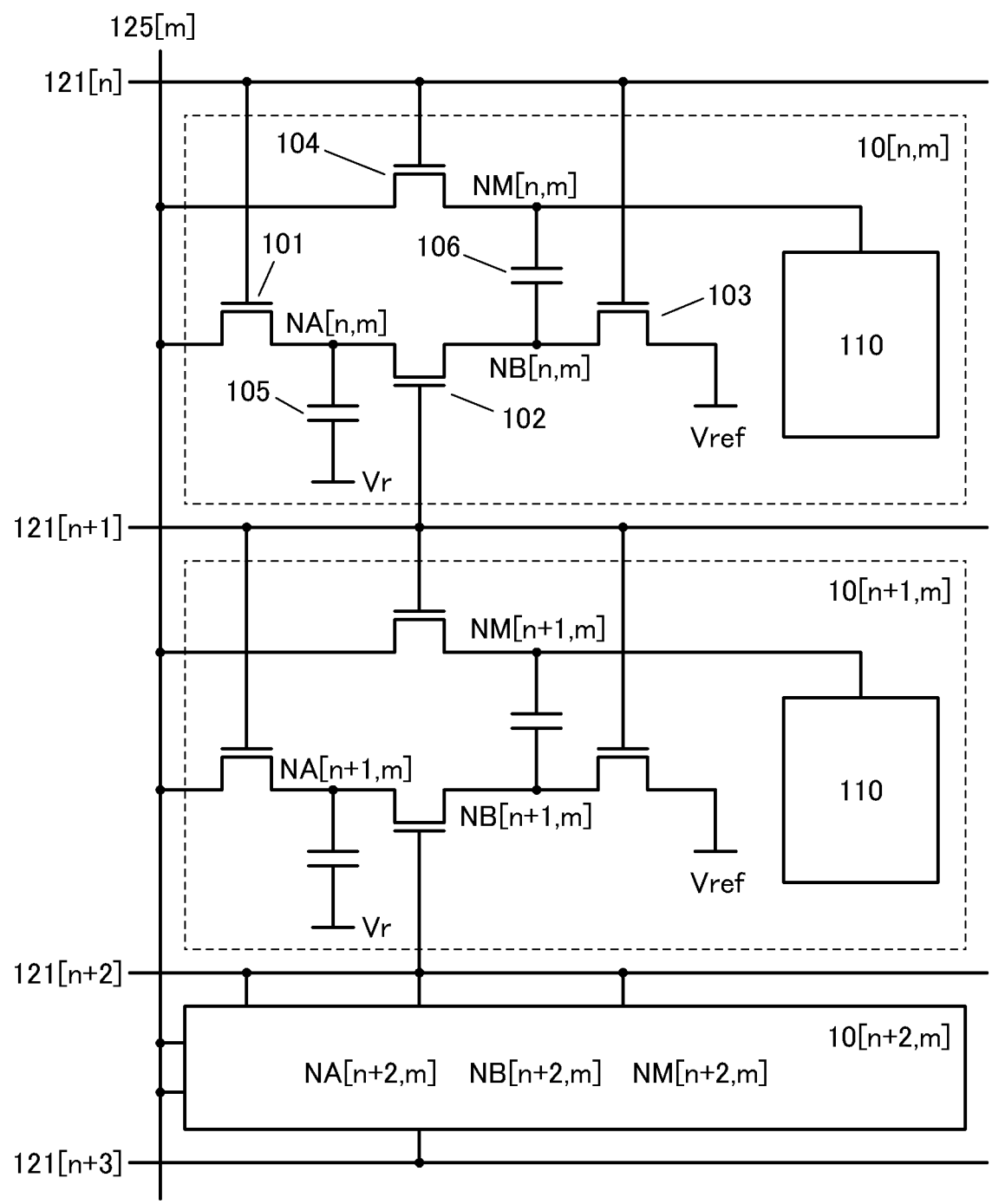
FIG. 2 A diagram illustrating a display device.

FIG. 2 illustrates specific examples of pixels 10 in the m-th column and the n-th to (n+2)-th rows (m and n are each a natural number greater than or equal to 1).

The pixel 10 can have a structure including a transistor 101, a transistor 102, a transistor 103, a transistor 104, a capacitor 105, a capacitor 106, and a circuit block 110. The circuit block 110 can include a transistor, a capacitor, a display element, and the like and will be described in detail later.

One of a source and a drain of the transistor 101 is electrically connected to one electrode of the capacitor 105. The one electrode of the capacitor 105 is electrically connected to one of a source and a drain of the transistor 102. The other of the source and the drain of the transistor 102 is electrically connected to one of a source and a drain of the transistor 103. The one of the source and the drain of the transistor 103 is electrically connected to one electrode of the capacitor 106. The other electrode of the capacitor 106 is electrically connected to one of a source and a drain of the transistor 104. The one of the source and the drain of the transistor 104 is electrically connected to the circuit block 110.

Here, a wiring to which the one of the source and the drain of the transistor 104, the other electrode of the capacitor 106, and the circuit block are connected is referred to as a node NM. The display element included in the circuit block 110 operates in accordance with the potential of the node NM. Note that a component of the circuit block 110 that is connected to the node NM can bring the node NM into a floating state.

A wiring to which the one of the source and the drain of the transistor 101, the one electrode of the capacitor 105, and the one of the source and the drain of the transistor 102 are connected is referred to as a node NA. A wiring to which the other of the source and the drain of the transistor 102, the one electrode of the capacitor 106, and the one of the source and the drain of the transistor 103 are connected is referred to as a node NB. Note that the memory unit M1 in FIG. 1 corresponds to the node NM and its peripheral element. The memory unit M2 in FIG. 1 corresponds to the node NA and its peripheral element. The display element 11 in FIG. 1 is one of the components included in the circuit block 110.

In the pixel 10[n,m] in the n-th row, a gate of the transistor 101, a gate of the transistor 103, and a gate of the transistor 104 are electrically connected to a wiring 121 [n]A gate of the transistor 102 is electrically connected to a wiring 121[n+1]. The other of the source and the drain of the transistor 101 and the other of the source and the drain of the transistor 104 are electrically connected to a wiring 125[m]. The other of the source and the drain of the transistor 103 is electrically connected to a wiring capable of supplying a specific potential "$V_{ref}$". The other electrode of the capacitor 105 is electrically connected to a wiring capable of supplying a specific potential "$V_r$".

In a pixel 10[n+1,m] in the (n+1)-th row, the gate of the transistor 101, the gate of the transistor 103, and the gate of the transistor 104 are electrically connected to a wiring 121[n+1]. The gate of the transistor 102 is electrically connected to a wiring 121[n+2]. The other of the source and the drain of the transistor 101 and the other of the source and the drain of the transistor 104 are electrically connected to the wiring 125[m]. The other of the source and the drain of the transistor 103 is electrically connected to a wiring capable of supplying a specific potential "$V_{ref}$". The other electrode of the capacitor 105 is electrically connected to a wiring capable of supplying a specific potential "$V_r$".

The wiring 121 has a function of a gate line and is electrically connected to the gate driver 13 (see FIG. 1). The wiring 125 has a function of a source line and is electrically connected to the source driver 12 (see FIG. 1).

As described above, the gate line (wiring 121) is electrically connected to the two pixels 10 adjacent to each other in the vertical direction. Thus, the two pixels 10 in the vertical direction can be operated in parallel.

As the wirings capable of supplying "$V_{ref}$" and "$V_r$", for example, a power supply line electrically connected to any of the components of the circuit block 110 can be used. Note that the wirings capable of supplying "$V_{ref}$" and "$V_r$" may be the same or different from each other.

The node NM, the node NA, and the node NB each serve as a storage node. When the transistor connected to the node is turned on, data can be written to the node. When the transistor is turned off, the data can be retained in the node. The use of a transistor with an extremely low off-state current as the transistor enables leakage current to be reduced and the potential of the node be retained for a long time. As the transistor, a transistor using a metal oxide in a channel formation region (hereinafter referred to as an OS transistor) can be used, for example.

Specifically, OS transistors are preferably used as the transistors 101, 102, 103, and 104. An OS transistor may also be used for any of the components included in the circuit block 110. In the case of operating within a range where the amount of leakage current is acceptable, a transistor including Si in a channel formation region (hereinafter, Si transistor) may be used. Alternatively, an OS transistor and a Si transistor may be used together. Examples of a Si transistor include a transistor including amorphous silicon and a transistor including crystalline silicon (typically, low-temperature polysilicon or single crystal silicon).

As a semiconductor material used for an OS transistor, a metal oxide whose energy gap is greater than or equal to 2 eV, preferably greater than or equal to 2.5 eV, more preferably greater than or equal to 3 eV can be used. A typical example thereof is an oxide semiconductor containing indium, and a CAAC-OS (C-Axis Aligned Crystalline Oxide Semiconductor), a CAC (Cloud-Aligned Composite)-OS, each of which will be described later, or the like can be used, for example. A CAAC-OS has a crystal structure including stable atoms and is suitable for a transistor that highly requires reliability, and the like. A CAC-OS has high mobility and is suitable for a transistor that operates at high speed, and the like.

An OS transistor has a large energy gap, and thus has characteristics with an extremely low off-state current of several yoctoamperes per micrometer (current per channel width of 1 μm). An OS transistor has features such that impact ionization, an avalanche breakdown, a short-channel effect, or the like does not occur, which are different from those of a Si transistor. Thus, the use of an OS transistor enables formation of a highly reliable circuit. Moreover, variations in electrical characteristics due to crystallinity unevenness, which are issues in Si transistors, are less likely to occur in OS transistors.

A semiconductor layer included in the OS transistor can be, for example, a film represented by an In-M-Zn-based oxide that contains indium, zinc, and M (a metal such as aluminum, titanium, gallium, germanium, yttrium, zirconium, lanthanum, cerium, tin, neodymium, or hafnium).

In the case where the oxide semiconductor contained in the semiconductor layer is an In-M-Zn-based oxide, it is preferable that the atomic ratio of metal elements of a sputtering target used to form a film of the In-M-Zn oxide satisfy In≥M and Zn≥M. The atomic ratio of metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio in the deposited semiconductor layer varies from the above atomic ratio of metal elements of the sputtering target in a range of ±40%.

An oxide semiconductor with low carrier density is used for the semiconductor layer. For example, an oxide semiconductor whose carrier density is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$, yet further preferably lower than $1\times10^{10}/cm^3$, and higher than or equal to $1\times10^{-9}/cm^3$ can be used for the semiconductor layer. Such an oxide semiconductor is referred to as a highly purified intrinsic or substantially highly purified intrinsic oxide semiconductor. The oxide semiconductor has a low density of defect states and thus can be regarded as an oxide semiconductor having stable characteristics.

Note that, without limitation to these, a material with an appropriate composition may be used in accordance with required semiconductor characteristics and electrical characteristics (e.g., field-effect mobility and threshold voltage) of a transistor. In order to obtain the required semiconductor characteristics of the transistor, it is preferable that the carrier density, the impurity concentration, the defect density, the atomic ratio between a metal element and oxygen, the interatomic distance, the density, and the like of the semiconductor layer be set to be appropriate.

When silicon or carbon, which is an element belonging to Group 14, is contained in the oxide semiconductor contained in the semiconductor layer, oxygen vacancies are increased, and the semiconductor layer becomes n-type. Thus, the concentration of silicon or carbon (the concentration obtained by SIMS: Secondary Ion Mass Spectrometry) in the semiconductor layer is set to lower than or equal to $2\times10^{18}$ atoms/$cm^3$, preferably lower than or equal to $2\times10^{17}$ atoms/$cm^3$.

Alkali metal and alkaline earth metal might generate carriers when bonded to an oxide semiconductor, in which case the off-state current of the transistor might be increased. Therefore, the concentration of alkali metal or alkaline earth metal in the semiconductor layer (the concentration obtained by SIMS) is set to lower than or equal to $1\times10^{18}$ atoms/$cm^3$, preferably lower than or equal to $2\times10^{16}$ atoms/$cm^3$.

When nitrogen is contained in the oxide semiconductor contained in the semiconductor layer, electrons serving as carriers are generated and the carrier density increases, so that the semiconductor layer easily becomes n-type. As a result, a transistor using an oxide semiconductor that contains nitrogen is likely to have normally-on characteristics. Hence, the concentration of nitrogen in the semiconductor layer (the concentration obtained by SIMS) is preferably set to lower than or equal to $5\times10^{18}$ atoms/$cm^3$.

When hydrogen is contained in the oxide semiconductor contained in the semiconductor layer, the hydrogen reacts with oxygen bonded to a metal atom to be water, and thus an oxygen vacancy is formed in the oxide semiconductor in some cases. When the channel formation region of the oxide semiconductor includes oxygen vacancies, the transistor has normally-on characteristics in some cases. Moreover, in some cases, a defect where hydrogen enters an oxygen vacancy functions as a donor and generates an electron serving as a carrier. Furthermore, in some cases, bonding of part of hydrogen to oxygen bonded to a metal atom causes generation of an electron serving as a carrier. Thus, a transistor using an oxide semiconductor that contains a large amount of hydrogen is likely to have normally-on characteristics.

A defect where hydrogen enters an oxygen vacancy can serve as a donor of the oxide semiconductor. However, it is difficult to evaluate the defects quantitatively. Thus, in some cases, a carrier concentration is selected for evaluation of an oxide semiconductor instead of a donor concentration. Accordingly, in this specification and the like, a carrier concentration assuming a state where no electric field is applied may be used for a parameter of an oxide semiconductor, instead of a donor concentration. That is, "carrier concentration" in this specification and the like can be replaced with "donor concentration" in some cases.

Thus, hydrogen in the oxide semiconductor is preferably reduced as much as possible. Specifically, the hydrogen concentration in the oxide semiconductor that is obtained by SIMS is set lower than $1\times10^{20}$ atoms/$cm^3$, preferably lower than $1\times10^{19}$ atoms/$cm^3$, further preferably lower than $5\times10^{18}$ atoms/$cm^3$, still further preferably lower than $1\times10^{18}$ atoms/$cm^3$. When an oxide semiconductor with sufficiently reduced impurities such as hydrogen is used for the channel formation region of the transistor, stable electrical characteristics can be given.

The semiconductor layer may have a non-single-crystal structure, for example. The non-single-crystal structure includes, for example, a CAAC-OS including a c-axis aligned crystal, a polycrystalline structure, a microcrystalline structure, or an amorphous structure. Among the non-single-crystal structures, an amorphous structure has the highest density of defect states, whereas CAAC-OS has the lowest density of defect states.

An oxide semiconductor film having an amorphous structure has disordered atomic arrangement and no crystalline component, for example. In another example, an oxide film having an amorphous structure has a completely amorphous structure and no crystal part.

Note that the semiconductor layer may be a mixed film including two or more of a region having an amorphous structure, a region having a microcrystalline structure, a region having a polycrystalline structure, a region of CAAC-OS, and a region having a single crystal structure. The mixed film has, for example, a single-layer structure or a stacked-layer structure including two or more of the above-described regions in some cases.

Described below is the composition of a CAC-OS, which is one embodiment of a non-single-crystal semiconductor layer.

The CAC-OS is, for example, a composition of a material in which elements included in an oxide semiconductor are unevenly distributed to have a size of greater than or equal to 0.5 nm and less than or equal to 10 nm, preferably greater than or equal to 1 nm and less than or equal to 2 nm, or a similar size. Note that in the following description, a state in which one or more metal elements are unevenly distributed and regions including the metal element(s) are mixed to have a size of greater than or equal to 0.5 nm and less than or equal to 10 nm, preferably greater than or equal to 1 nm and less than or equal to 2 nm, or a similar size in an oxide semiconductor is referred to as a mosaic pattern or a patch-like pattern.

Note that an oxide semiconductor preferably contains at least indium. In particular, indium and zinc are preferably contained. In addition, one or more kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, CAC-OS in an In—Ga—Zn oxide (of the CAC-OS, an In—Ga—Zn oxide may be particularly referred to as CAC-IGZO) has a composition (hereinafter, referred to as cloud-like composition) in which materials are separated into indium oxide (hereinafter, $InO_{X1}$ (X1 is a real number greater than 0)) or indium zinc oxide (hereinafter, $In_{X2}Zn_{Y2}O_{Z2}$ (X2, Y2, and Z2 are real numbers greater than 0)), and gallium oxide (hereinafter, $GaO_{X3}$ (X3 is a real number greater than 0)) or gallium zinc oxide (hereinafter, $Ga_{X4}Zn_{Y4}O_{Z4}$ (X4, Y4, and Z4 are real numbers greater than 0)) to form a mosaic pattern, and $InO_{X1}$ or $In_{X2}Zn_{Y2}O_{Z2}$ forming the mosaic pattern is evenly distributed in the film.

That is, the CAC-OS is a composite oxide semiconductor with a composition in which a region containing $GaO_{X3}$ as a main component and a region containing $In_{X2}Zn_{Y2}O_{Z2}$ or $InO_{X1}$ as a main component are mixed. Note that in this specification, for example, when the atomic ratio of In to an element M in a first region is greater than the atomic ratio of In to an element M in a second region, the first region is described as having higher In concentration than the second region.

Note that IGZO is a common name, which may specify a compound containing In, Ga, Zn, and O. Typical examples of IGZO include a crystalline compound represented by $InGaO_3(ZnO)_{m1}$ (m1 is a natural number) and a crystalline compound represented by $In_{(1-x0)}Ga_{(1-x0)}O_3(ZnO)_{m0}$ (−1≤x0≤1; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

The CAC-OS relates to the material composition of an oxide semiconductor. The CAC-OS refers to a composition in which, in the material composition containing In, Ga, Zn, and O, some regions that contain Ga as a main component and are observed as nanoparticles and some regions that contain In as a main component and are observed as nanoparticles are randomly dispersed in a mosaic pattern. Thus, the crystal structure is a secondary element for the CAC-OS.

Note that in the CAC-OS, a stacked-layer structure including two or more films with different atomic ratios is not included. For example, a two-layer structure of a film containing In as a main component and a film containing Ga as a main component is not included.

Note that a boundary between the region containing $GaO_{X3}$ as a main component and the region containing $In_{X2}Zn_{Y2}O_{Z2}$ or $InO_{X1}$ as a main component is not clearly observed in some cases.

In the case where one or more kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, nanoparticle regions containing the metal element(s) as a main component(s) are observed in part of a CAC-OS and nanoparticle regions containing In as a main component are observed in part of the CAC-OS, and these nanoparticle regions are randomly dispersed to form a mosaic pattern in the CAC-OS.

The CAC-OS can be formed by a sputtering method under a condition where a substrate is not heated intentionally, for example. In the case where the CAC-OS is formed by a sputtering method, one or more selected from an inert gas (typically, argon), an oxygen gas, and a nitrogen gas may be used as a deposition gas. The ratio of the flow rate of the oxygen gas to the total flow rate of the deposition gas in deposition is preferably as low as possible; for example, the ratio of the flow rate of the oxygen gas is higher than or equal to 0% and lower than 30%, preferably higher than or equal to 0% and lower than or equal to 10%.

The CAC-OS is characterized in that no clear peak is observed at the time of measurement using θ/2θ scan by an Out-of-plane method, which is one of the X-ray diffraction (XRD) measurement methods. That is, it is found from X-ray diffraction measurement that no alignment in an a-b plane direction and a c-axis direction is observed in a measured region.

In addition, in an electron diffraction pattern of the CAC-OS that is obtained by irradiation with an electron beam with a probe diameter of 1 nm (also referred to as a nanobeam electron beam), a ring-like high-luminance region (ring region) and a plurality of bright spots in the ring region are observed. Thus, it is found from the electron diffraction pattern that the crystal structure of the CAC-OS includes an nc (nanocrystalline) structure with no alignment in a plan-view direction and a cross-sectional direction.

Moreover, for example, it can be confirmed by EDX mapping obtained using energy dispersive X-ray spectroscopy (EDX) that the CAC-OS in the In—Ga—Zn oxide has a composition in which regions where $GaO_{X3}$ is a main component and regions where $In_{X2}Zn_{Y2}O_{Z2}$ or $InO_{X1}$ is a main component are unevenly distributed and mixed.

The CAC-OS has a structure different from that of an IGZO compound in which metal elements are evenly distributed, and has characteristics different from those of the IGZO compound. That is, the CAC-OS has a composition in which regions containing $GaO_{X3}$ or the like as a main component and regions containing $In_{X2}Zn_{Y2}O_{Z2}$ or $InO_{X1}$ as a main component are phase-separated from each other, and the regions including the respective elements as the main components form a mosaic pattern.

The conductivity of the region containing $In_{X2}Zn_{Y2}O_{Z2}$ or $InO_{X1}$ as a main component is higher than that of the region containing $GaO_{X3}$ or the like as a main component. In other words, when carriers flow through regions containing $In_{X2}Zn_{Y2}O_{Z2}$ or InOxi as a main component, the conductivity of an oxide semiconductor is generated. Accordingly, when regions containing $In_{X2}Zn_{Y2}O_{Z2}$ or $InO_{X1}$ as a main component are distributed in an oxide semiconductor like a cloud, high field-effect mobility (μ) can be achieved.

In contrast, the insulating property of a region containing $GaO_{X3}$ or the like as a main component is higher than that of a region containing $In_{X2}Zn_{Y2}O_{Z2}$ or $InO_{X1}$ as a main component. In other words, when regions containing $GaO_{X3}$ or the like as a main component are distributed in an oxide semiconductor, leakage current can be suppressed and favorable switching operation can be achieved.

Accordingly, in the case where a CAC-OS is used in a semiconductor element, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility (μ) can be achieved.

A semiconductor element using a CAC-OS has high reliability. Thus, the CAC-OS is suitable as a constituent material in a variety of semiconductor devices.

Figure 3A:
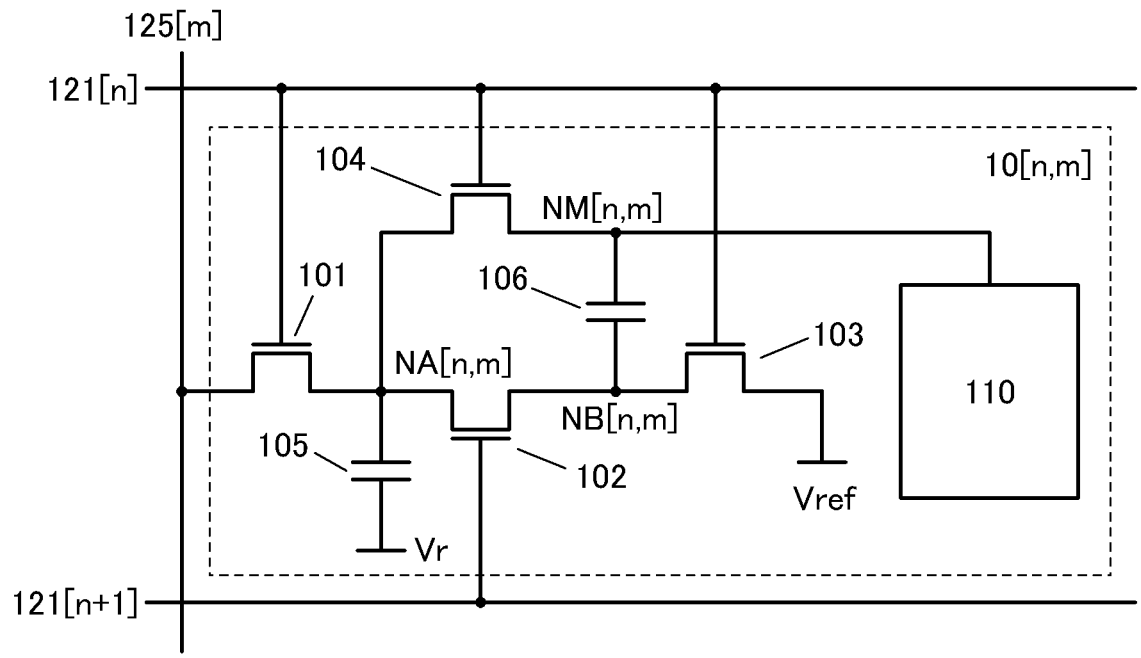
FIGS. 3A and 3B Diagrams each illustrating a display device.
Figure 3B:
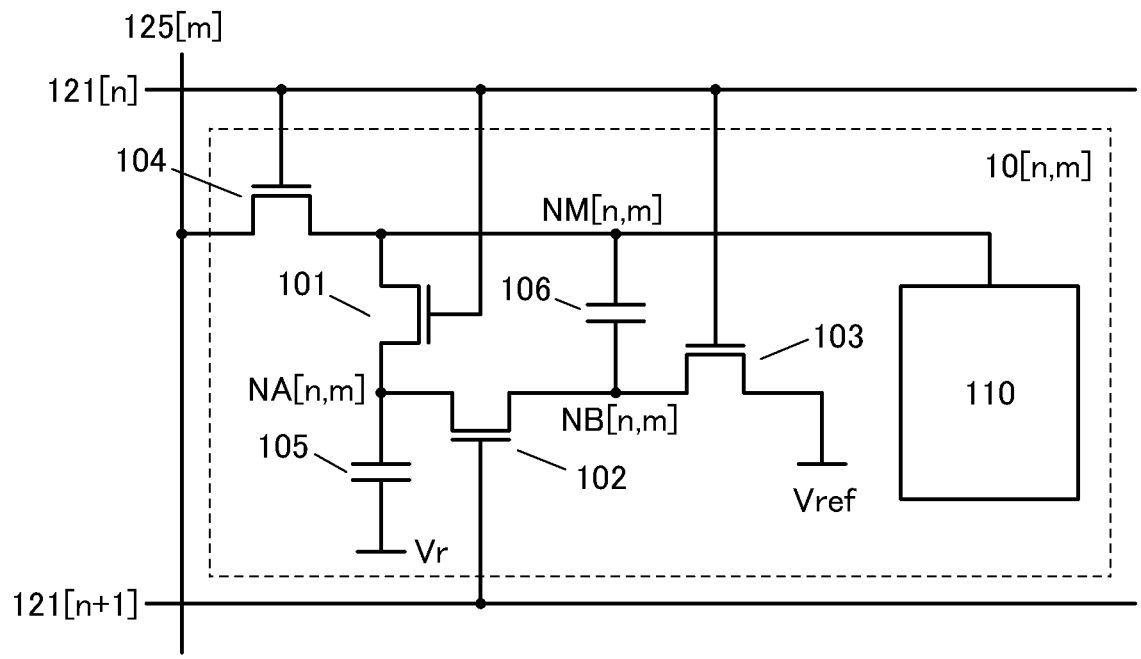

Note that the pixel 10 may have the configuration illustrated in FIG. 3(A) or FIG. 3(B). FIG. 3(A) is an example in which the other of the source and the drain of the transistor 104 is connected to the one of the source and the drain of the transistor 101. FIG. 3(B) is an example in which the other of the source and the drain of the transistor 101 is connected to the one of the source and the drain of the transistor 104. With either of the configurations, an operation similar to that of the configuration in FIG. 2 can be performed.

Since capacitive coupling is used in the addition operation of the pixel 10, the capacity value of the capacitor 105 provided on the supplier side is preferably large. On the other hand, the area occupied by the capacitor is preferably as small as possible in order to increase the aperture ratio of the pixel. Thus, a configuration in which a capacitor is shared between pixels may be employed.

In the pixel 10 which is not performing new write operation, display operation is not affected by change in the potential written to the capacitor 105. Thus, the capacitor 105 can be shared by more than one pixels 10 to increase the capacity value. Note that the pixels 10 that can share the capacitor 105 are limited to pixels 10 that are not operated in parallel.

Figure 4:
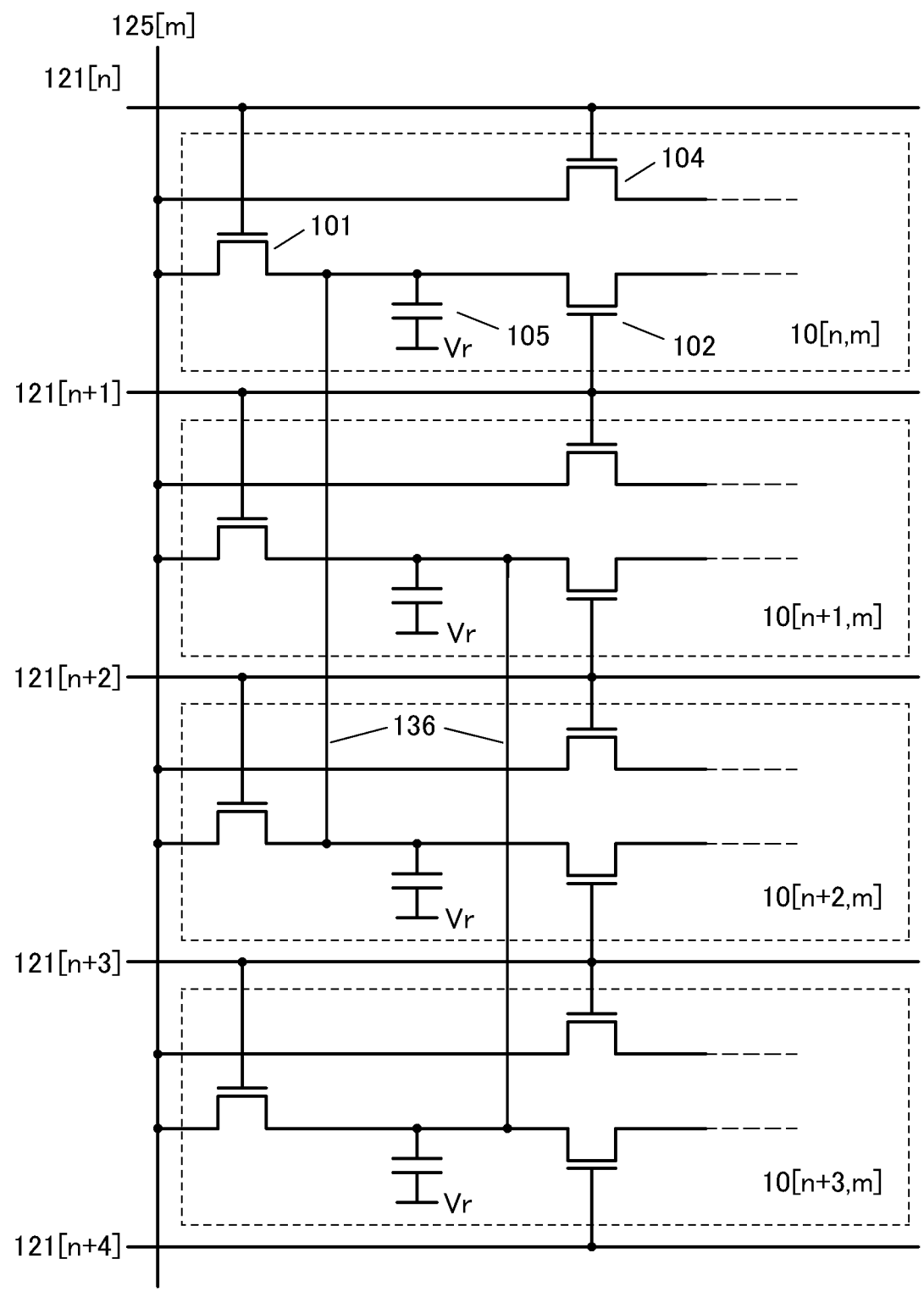
FIG. 4 A diagram illustrating a display device.

As illustrated in FIG. 4, connection lines 136 can be provided such that the capacitors 105 of every other pixel 10 in the vertical direction are electrically connected to each other in parallel, for example. Although a configuration in which the capacitor 105 is shared by two pixels 10 is shown in FIG. 4, the capacitor 105 may be shared by three or more pixels 10 as long as the three or more pixels 10 are every other pixel 10 in the vertical direction.

Figure 5:
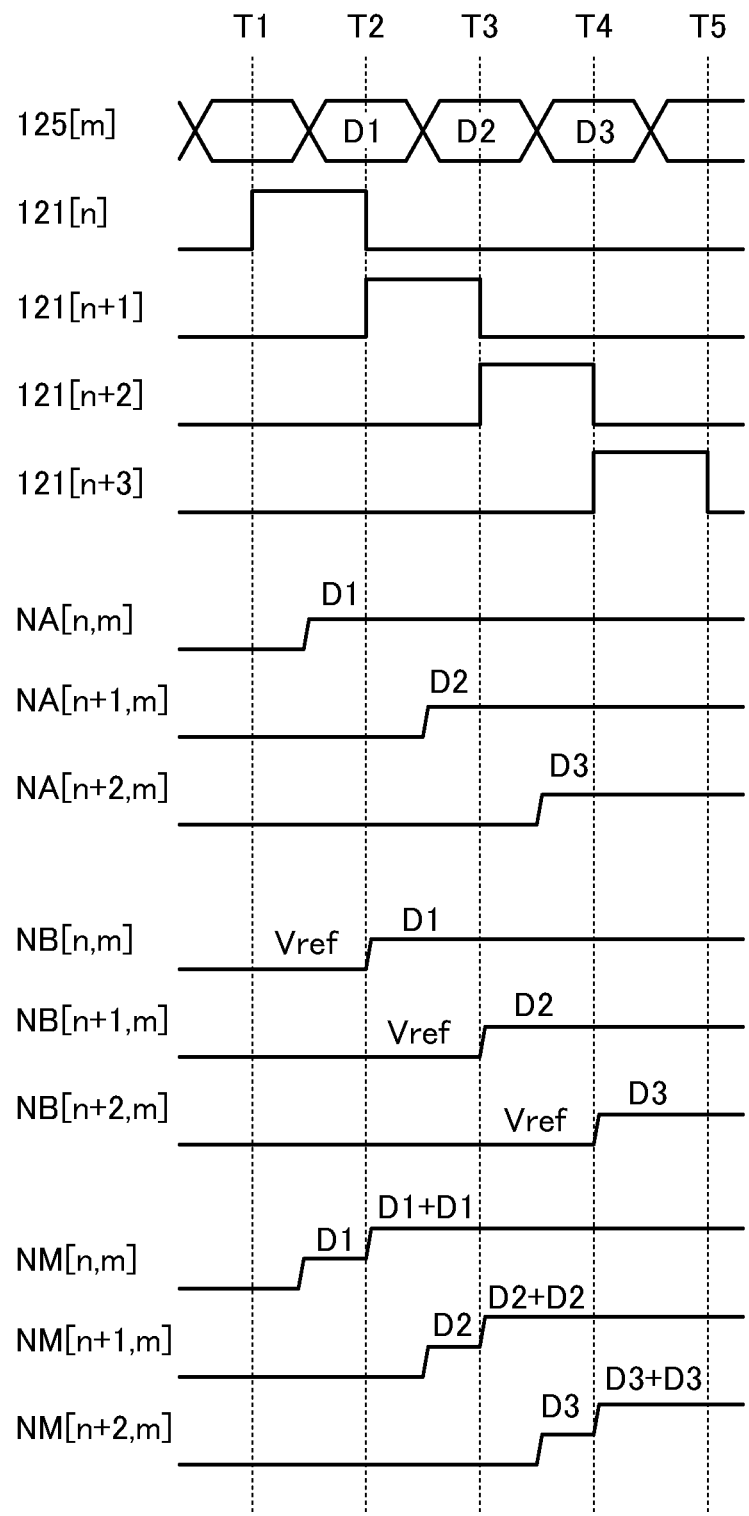
FIG. 5 A timing chart illustrating the operation of a display device.

An example of operation of adding image data supplied to the pixel 10 is described with reference to a timing chart shown in FIG. 5. Note that in the following description, "H" represents a high potential and "L" represents a low potential. Image data supplied when writing to the pixels in the first row is performed is "D1", image data supplied when writing to the pixels in the second row is performed is "D2", and image data supplied when writing to the pixels in the third row is performed in "D3". As "$V_{ref}$", 0 V, a GND potential, or a certain reference potential can be used, for example.

First, operation of writing "D1" to the node NA[n,m] and the node NM[n,m] in the pixel 10[n,m] in the n-th row is described. Note that in potential distribution, potential coupling, or potential loss, detailed changes due to a circuit configuration, operation timing, or the like are not considered. In addition, a potential change due to capacitive coupling depends on the ratio of the capacitance of a potential supplier to that of a potential receiver; however, for clarity of description, the capacity value of the circuit block 110 is assumed to be sufficiently small.

When the potential of the wiring 121[n] is set to "H" at Time T1 the transistor 103 is turned on and the potential of the one electrode of the capacitor 106 becomes "$V_{ref}$" in the pixel 10[n,m]. The operation is a reset operation for addition operation (capacitive coupling operation) to be performed later. Furthermore, the transistor 101 is turned on, and the potential of a wiring 125[m] is written to the node NA[n,m]. In addition, the transistor 104 is turned on, and the potential of the wiring 125[m] is written to the node NM[n,m]. This operation is the image data write operation and the potentials of the node NA[n,m] and the node NM[n,m] become "D1".

When the potential of the wiring 121[n] is set to "L" at Time T2, the transistor 101, the transistor 103, and the transistor 104 are turned off. At this time, "D1" is held in the node NA[n,m] and the node NM[n,m]. In addition, "D1−$V_{ref}$" is held in the capacitor 106.

The write operation of "D1" in the pixel 10[n,m] has been described so far. Next, the addition operation of "D1" in the pixel 10[n,m] and the write operation of "D2" in a pixel 10[n+1,m] are described.

When the potential of the wiring 121[n+1] is set to "H" at Time T2, in the pixel 10[n,m], the transistor 102 is turned on and "D1" held in the node NA[n,m] is read out to the node NB[n,m]. At this time, capacitive coupling of the capacitor 106 adds the potential of the node NB[n,m] "D1" to the potential of the node NM[n,m]. This operation is addition operation and the potential of the node NM[n,m] becomes "D1−$V_{ref}$+D1". At this time, when "$V_{ref}$=0, the potential of the node NM[n,m] becomes "D1+D1". In other words, the data originally held in the node NA[n,m] and the node NM[n,m] can be added.

In the pixel 10[n+1,m], the transistor 103 is turned on and the potential of the one electrode of the capacitor 106 becomes "$V_{ref}$". The transistor 101 is turned on, and the potential of the wiring 125[m] is written to the node NA[n+1,m]. In addition, the transistor 104 is turned on, and the potential of the wiring 125[m] is written to the node NM[n+1,m]. This operation is the image data write operation and the potentials of the node NA[n+1,m] and the node NM[n+1,m] become "D2".

The addition operation of "D1" in the pixel 10[n,m] and the write operation of "D2" in the pixel 10[n+1,m] have been described so far. Next, the addition operation of "D2" in the pixel 10[n+1,m] and the write operation of "D3" in the pixel 10[n+2,m] are described.

When the potential of the wiring 121[n+2] is set to "H" at Time T3, in the pixel 10[n+1,m], the transistor 102 is turned on and "D2" held in the node NA[n+1,m] is read out to the node NB[n+1,m]. At this time, capacitive coupling of the capacitor 106 adds the potential of the node NB[n+1,m] "D2" to the potential of the node NM[n+1,m]. This operation is addition operation and the potential of the node NM[n+1,m] becomes "D2−$V_{ref}$+D2". At this time, when "$V_{ref}$=0, the potential of the node NM[n+1,m] becomes "D2+D2".

In the pixel 10[n+2,m], the transistor 103 is turned on and the potential of the one electrode of the capacitor 106 becomes "$V_{ref}$". The transistor 101 is turned on, and the potential of the wiring 125[m] is written to the node NA[n+2,m]. In addition, the transistor 104 is turned on, and the potential of the wiring 125[m] is written to the node NM[n+

2,m]. This operation is the write operation of image data and the potentials of the node NA[n+2,m] and the node NM[n+2,m] become "D3".

The addition operation of "D2" in the pixel 10[n+1,m] and the write operation of "D3" in the pixel 10[n+2,m] have been described so far. In the pixel 10[n+2,m], the same operation as that described above using the timing chart in FIG. 5 is performed, whereby addition operation of "D3" can be performed.

As described above, in one embodiment of the present invention, operation of adding two pieces of image data can be performed. By the addition of image data, a potential higher than or equal to the maximum output voltage of the source driver can be supplied to a display element, which can contribute to an improvement in display luminance and an increase in dynamic range. In the case where a standard display is performed, the output voltage of the source driver can be reduced almost by half, or the power consumption can be lowered.

Furthermore, the image data write operation in pixels in the n-th row and the image data addition operation in pixels in the (n+1)-th row can be performed in parallel, which can increase the frame frequency. Therefore, the frame frequency can be easily increased even in the case where the horizontal period is short due to an increase in the number of pixels. One embodiment of the present invention is suitable for a field-sequential liquid crystal display device that requires high-speed operation.

Figure 6A:
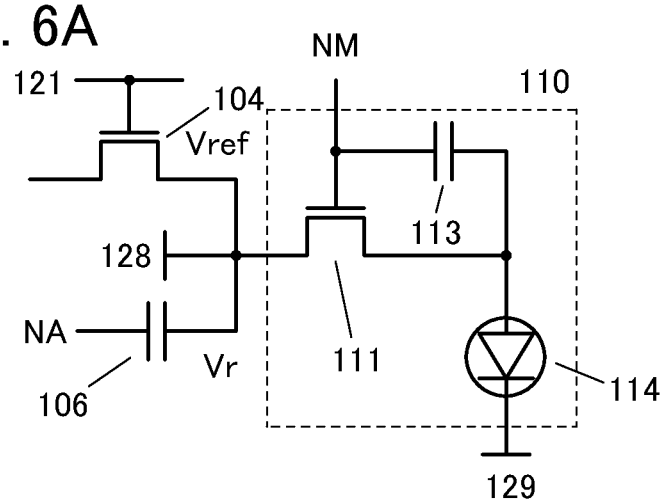
FIGS. 6A to 6C Diagrams each illustrating a circuit block.
Figure 6B:
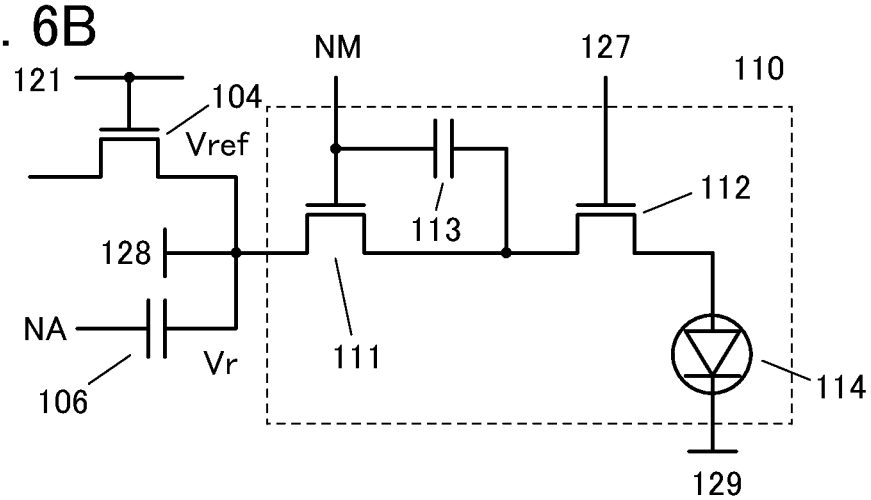
Figure 6C:
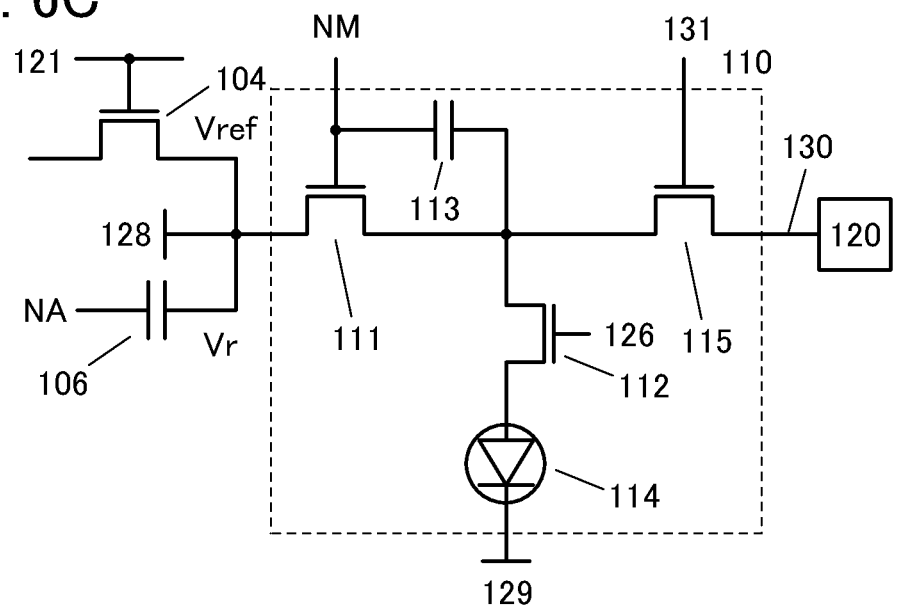

FIGS. 6(A) to 6(C) are examples of a structure including an EL element as the display element, which can be applied to the circuit block 110.

The structure illustrated in FIG. 6(A) includes a transistor 111, a capacitor 113, and an EL element 114. One of a source and a drain of the transistor 111 is electrically connected to one electrode of the EL element 114. The one electrode of the EL element 114 is electrically connected to one electrode of the capacitor 113. The other electrode of the capacitor 113 is electrically connected to a gate of the transistor 111. The gate of the transistor 111 is electrically connected to the node NM.

The other of the source and the drain of the transistor 111 is electrically connected to a wiring 128. The other electrode of the EL element 114 is electrically connected to a wiring 129. The wirings 128 and 129 have a function of supplying power. For example, the wiring 128 is capable of supplying a high potential power. The wiring 129 is capable of supplying a low potential power.

Here, the wiring 128 can be used as the wiring for supplying "$V_{ref}$" shown in FIG. 1. The wiring 128 can also be used as the wiring for supplying "$V_r$". Since "$V_{ref}$" and "$V_r$" are preferably 0 V, GND, or a low potential, the wiring 128 also has a function of supplying at least any of these potentials. To the wiring 128, "$V_{ref}$" and "$V_r$" are supplied at the timing when data is written to the node NM, and a high potential power is supplied at the timing when the EL element 114 emits light. Note that a dedicated common wiring for supplying "$V_{ref}$" and "$V_r$" may be provided.

In the structure illustrated in FIG. 6(A), current flows through the EL element 114 when the potential of the node NM becomes higher than or equal to the threshold voltage of the transistor 111. Therefore, in some cases, the EL element 114 starts light emission at the stage of the image data write shown in the timing chart in FIG. 5, which might limit the applications.

FIG. 6(B) shows a structure in which a transistor 112 is added to the structure in FIG. 6(A). One of a source and a drain of the transistor 112 is electrically connected to the one of the source and the drain of the transistor 111. The other of the source and the drain of the transistor 112 is electrically connected to the EL element 114. A gate of the transistor 112 is electrically connected to a wiring 127. The wiring 127 can have a function of a signal line that controls the conduction of the transistor 112.

In the structure, current flows through the EL element 114 when the potential of the node NM is higher than or equal to the threshold voltage of the transistor 111 and the transistor 112 is turned on. Thus, the EL element 114 can start light emission after the second write operation shown in the timing chart in FIG. 3.

FIG. 6(C) shows a structure in which a transistor 115 is added to the structure in FIG. 6(B). One of a source and a drain of the transistor 115 is electrically connected to the one of the source and the drain of the transistor 111. The other of the source and the drain of the transistor 115 is electrically connected to a wiring 130. A gate of the transistor 115 is electrically connected to a wiring 131. The wiring 131 can have a function of a signal line controlling the conduction of the transistor 115.

The wiring 130 can be electrically connected to a supply source of a certain potential such as a reference potential. The certain potential is supplied from the wiring 130 to the one of the source and the drain of the transistor 111, whereby write of the image data can be stable.

In addition, the wiring 130 can be connected to a circuit 120 and can also have a function of a monitor line. The circuit 120 can have one or more of the function of supplying the above certain potential, the function of obtaining electric characteristics of the transistor 111, and the function of generating correction data.

Figure 7A:
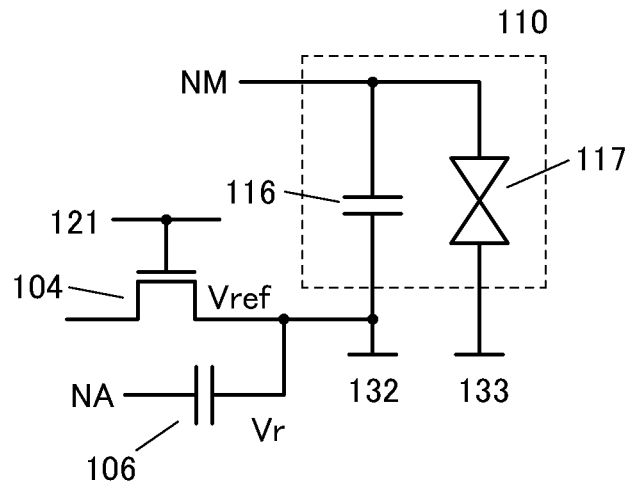
FIGS. 7A to 7C Diagrams each illustrating a circuit block.
Figure 7B:
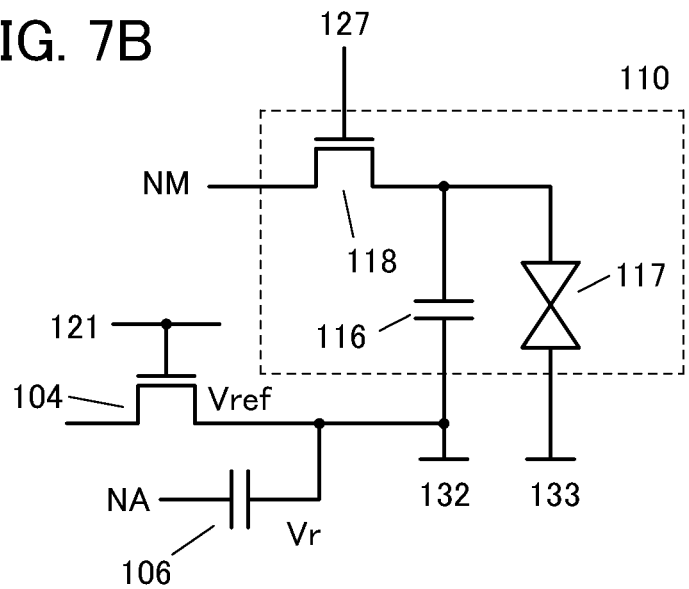
Figure 7C:
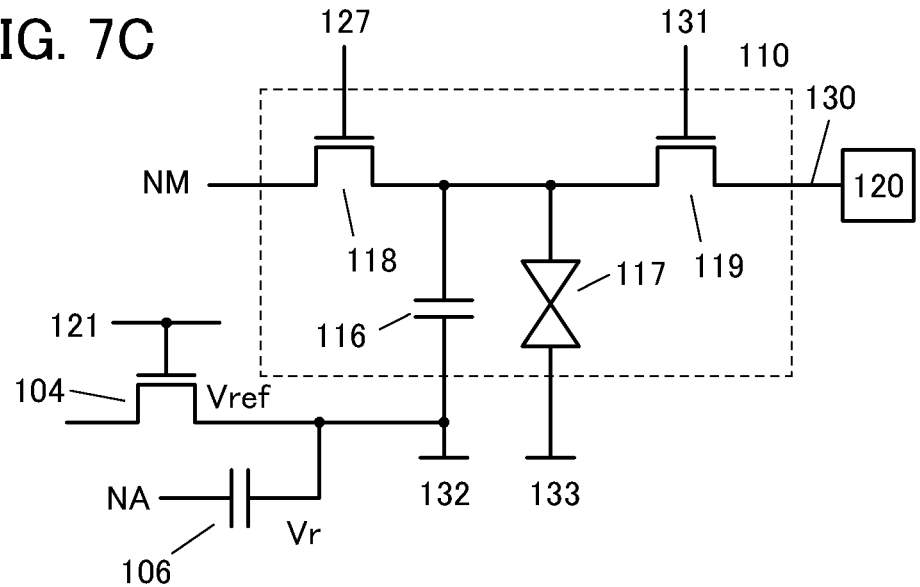

FIGS. 7(A) to 7(C) each illustrate an example of a structure including a liquid crystal element as the display element, which can be applied to the circuit block 110.

The structure illustrated in FIG. 7(A) includes a capacitor 116 and a liquid crystal element 117. One electrode of the liquid crystal element 117 is electrically connected to one electrode of the capacitor 116. The one electrode of the capacitor 116 is electrically connected to the node NM.

The other electrode of the capacitor 116 is electrically connected to a wiring 132. The other electrode of the liquid crystal element 117 is electrically connected to a wiring 133. The wirings 132 and 133 have a function of supplying power. The wirings 132 and 133 are capable of supplying a reference potential such as GND or 0 V or a given potential, for example.

Here, the wiring 132 can be used as the wiring for supplying "$V_{ref}$" shown in FIG. 1. The wiring 132 can also be used as the wiring for supplying "$V_r$". Note that a dedicated common wiring for supplying "$V_{ref}$" and "$V_r$" may be provided.

In this structure, the operation of the liquid crystal element 117 starts when the potential of the node NM is set higher than or equal to the operation threshold of the liquid crystal element 117. Thus, in some cases, the display operation starts at the stage of the image data write operation shown in the timing chart in FIG. 5, which might limit the applications. However, for a transmissive liquid crystal display device, a possible unnecessary display operation can be made less visible when the operation of, for example, turning off a backlight is combined until after the image data addition operation shown in the timing chart in FIG. 5.

FIG. 7(B) shows a structure in which a transistor 118 is added to the structure in FIG. 7(A). One of a source and a drain of the transistor 118 is electrically connected to the one electrode of the capacitor 116. The other of the source and the drain of the transistor 118 is electrically connected to the node NM. A gate of the transistor 118 is electrically connected to the wiring 127. The wiring 127 can have a function of a signal line that controls the conduction of the transistor 118.

In this structure, the potential of the node NM is applied to the liquid crystal element 117 when the transistor 118 is turned on. Thus, operation of the liquid crystal element can start after the image data addition operation in the timing chart shown in FIG. 5.

While the transistor 118 is in a non-conduction state, the potentials supplied to the capacitor 116 and the liquid crystal element 117 are held continuously; thus, the potentials supplied to the capacitor 116 and the liquid crystal element 117 are preferably reset before the image data is rewritten. For the reset, a reset potential may be supplied to the source line to which the pixel is connected (the wiring 125 shown in FIG. 2) to bring the transistor 103 and the transistor 118 into conduction at the same time, for example.

FIG. 7(C) shows a structure in which a transistor 119 is added to the structure in FIG. 7(B). One of a source and a drain of the transistor 119 is electrically connected to the one electrode of the liquid crystal element 117. The other of the source and the drain of the transistor 119 is electrically connected to the wiring 130. A gate of the transistor 119 is electrically connected to the wiring 131. The wiring 131 can have a function of a signal line controlling the conduction of the transistor 119.

The circuit 120 electrically connected to the wiring 130 is as described above using FIG. 6(C) and also may have a function of resetting the potentials supplied to the capacitor 116 and the liquid crystal element 117.

Figure 8A:
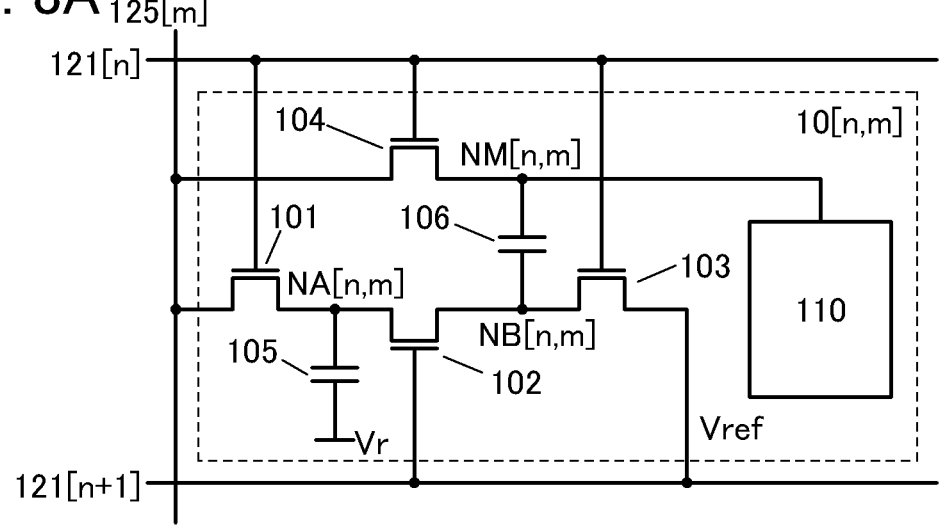
FIGS. 8A to 8C Diagrams each illustrating a pixel circuit.

Although the examples in which "$V_{ref}$" is supplied from the power supply line are shown in FIG. 6 and FIG. 7, "$V_{ref}$" can be supplied from a gate line. As illustrated in FIG. 8(A), for example, "$V_{ref}$" may be supplied from the wiring 121 in the pixel 10[n,m]. Since a potential corresponding to "L" is supplied to the wiring 121[n+1,m] when "D1" is written (when the transistor 103 is turned on), as shown in the timing chart in FIG. 5, this potential can be used as "$V_{ref}$".

Figure 8B:
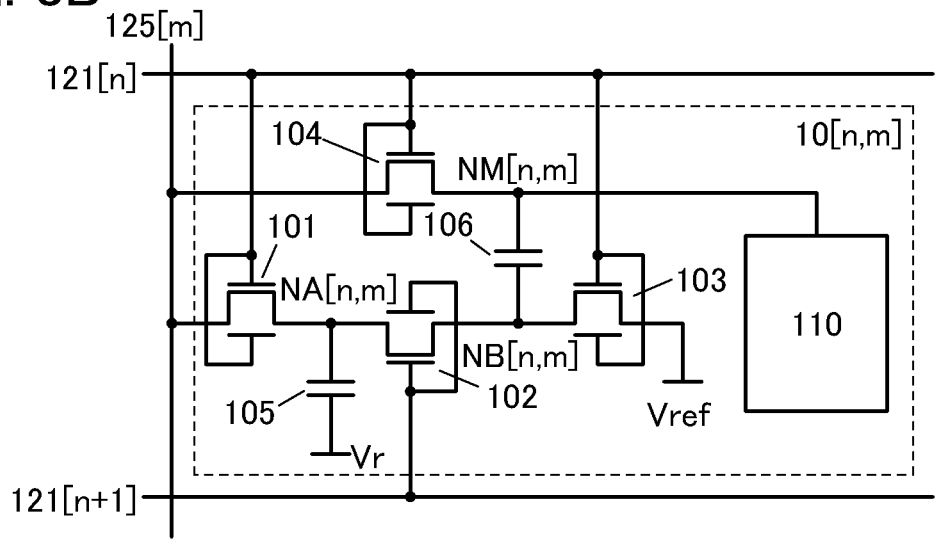
Figure 8C:
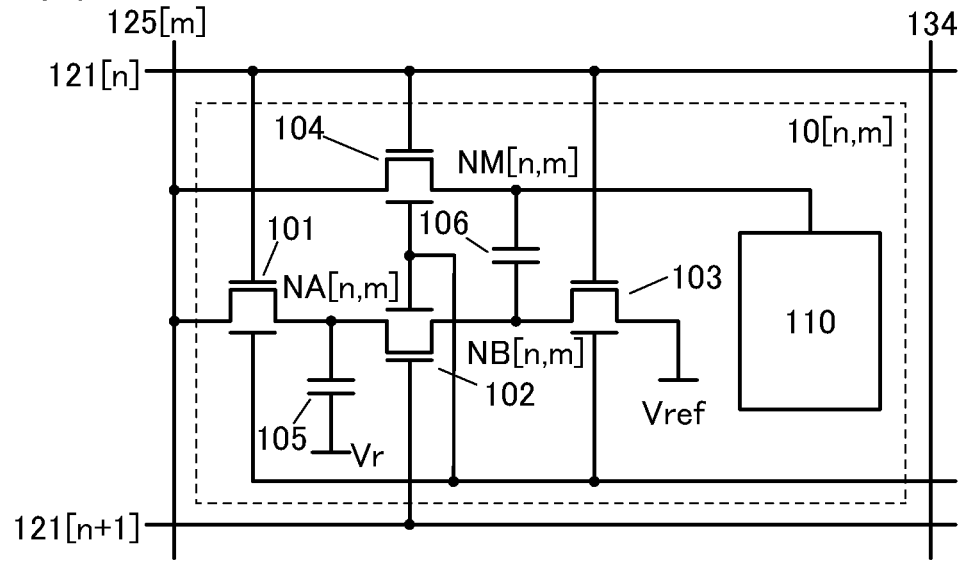

In addition, as illustrated in FIGS. 8(B) and 8(C), a structure may be employed in which the transistors 101, 102, 103, and 104 each include a back gate. FIG. 8(B) shows a structure in which the back gates are electrically connected to the front gates, which has an effect of increasing on-state currents. FIG. 8(C) shows a structure in which the back gates are electrically connected to a wiring 134 capable of supplying a constant potential, which enables the threshold voltages of the transistors to be controlled. Note that back gates may also be provided for the transistors included in the circuit block 110 illustrated in FIGS. 6(A) to 6(C) and FIGS. 7(A) to 7(C).

Figure 9A:
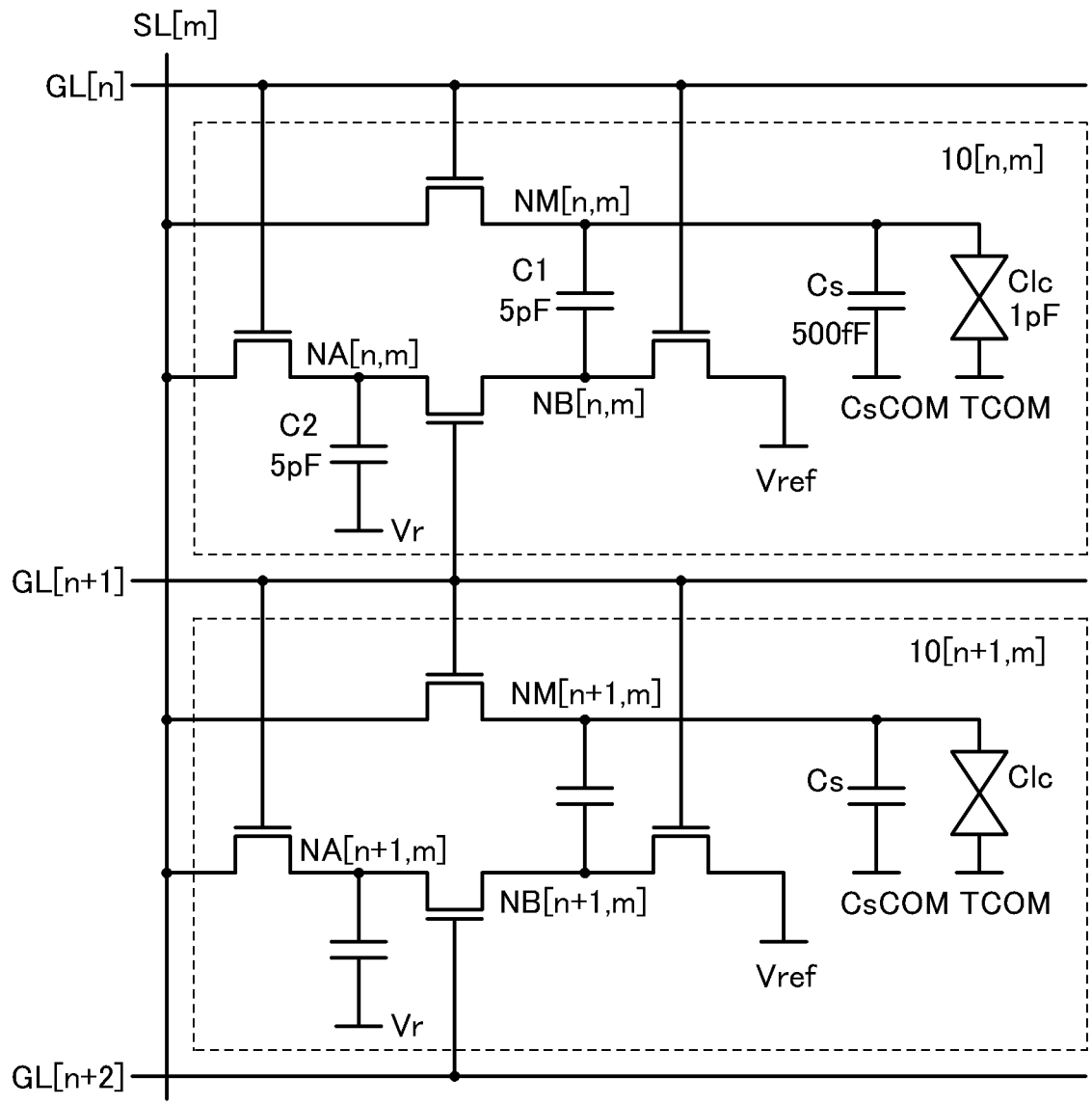
FIGS. 9A and 9B A diagram illustrating a structure display device used for a simulation, and a timing chart.

Next, simulation results of a structure in which the circuit block illustrated in FIG. 7(A) is used for the pixel 10 in the display device illustrated in FIG. 2 (see FIG. 9(A)) are described. The parameters are as follows: transistor size: L/W=4 µm/40 µm (the transistor included in the pixel 10), capacity values of capacitors C1 and C2: 5 pF, capacity value of capacitor Cs: 500 fF, capacity value of liquid crystal element Clc: 1 pF, image data (DATA): 5 V at a maximum, "$V_{ref}$" and "$V_r$": 0 V, common electrodes CsCOM and TCOM: 0 V. In addition, the voltage applied to the gate of the transistor is set to +20 V as "H" and −20 V as "L". Note that SPICE is used as circuit simulation software.

Figure 9B:
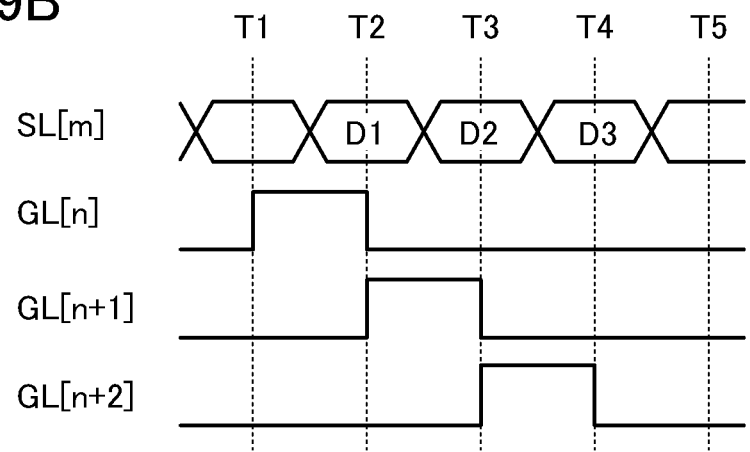
Figure 10:
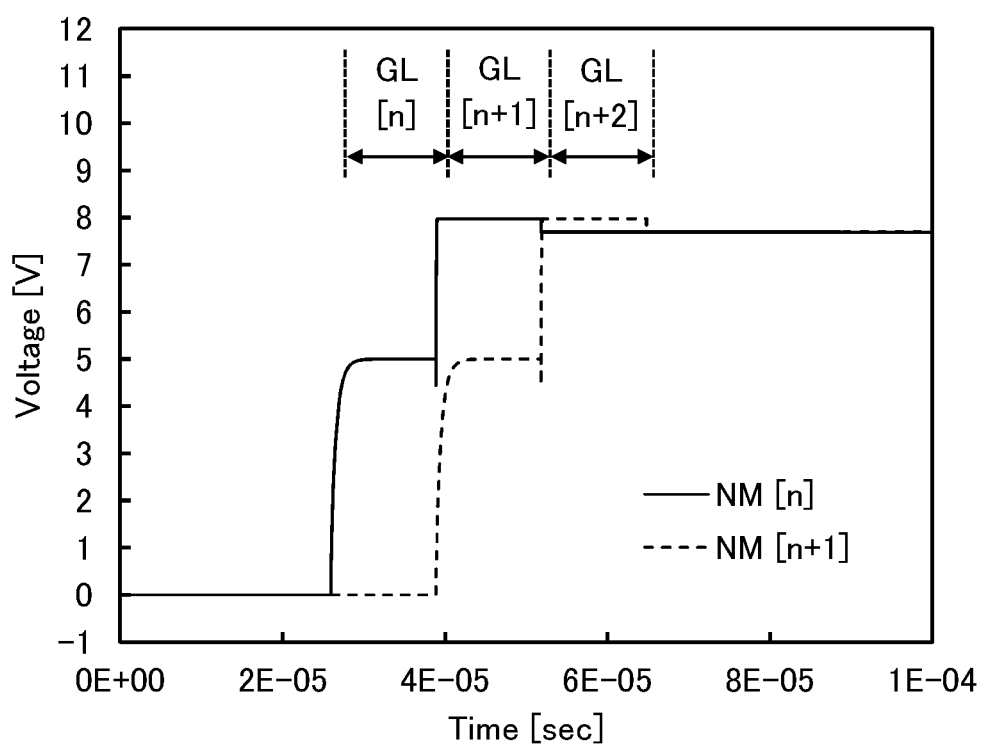
FIG. 10 A diagram showing simulation results.

The simulation results of a case where the circuit illustrated in FIG. 9(A) is operated in accordance with the timing chart shown in FIG. 9(B) are shown in FIG. 10.

FIG. 10 shows simulation results of voltages at the node NM[n] and the node NM[n+1] when +5 V is input as image data (DATA). In the node NM[n], it is found that the first write operation is performed at the timing when GL[n] becomes "H", the second write operation is performed at the timing when GL[n+1] becomes "H", and the image data (DATA) is added up in accordance with the capacity ratio between the supplier and the receiver. The same applies to the node NM[n+1].

Figure 11:
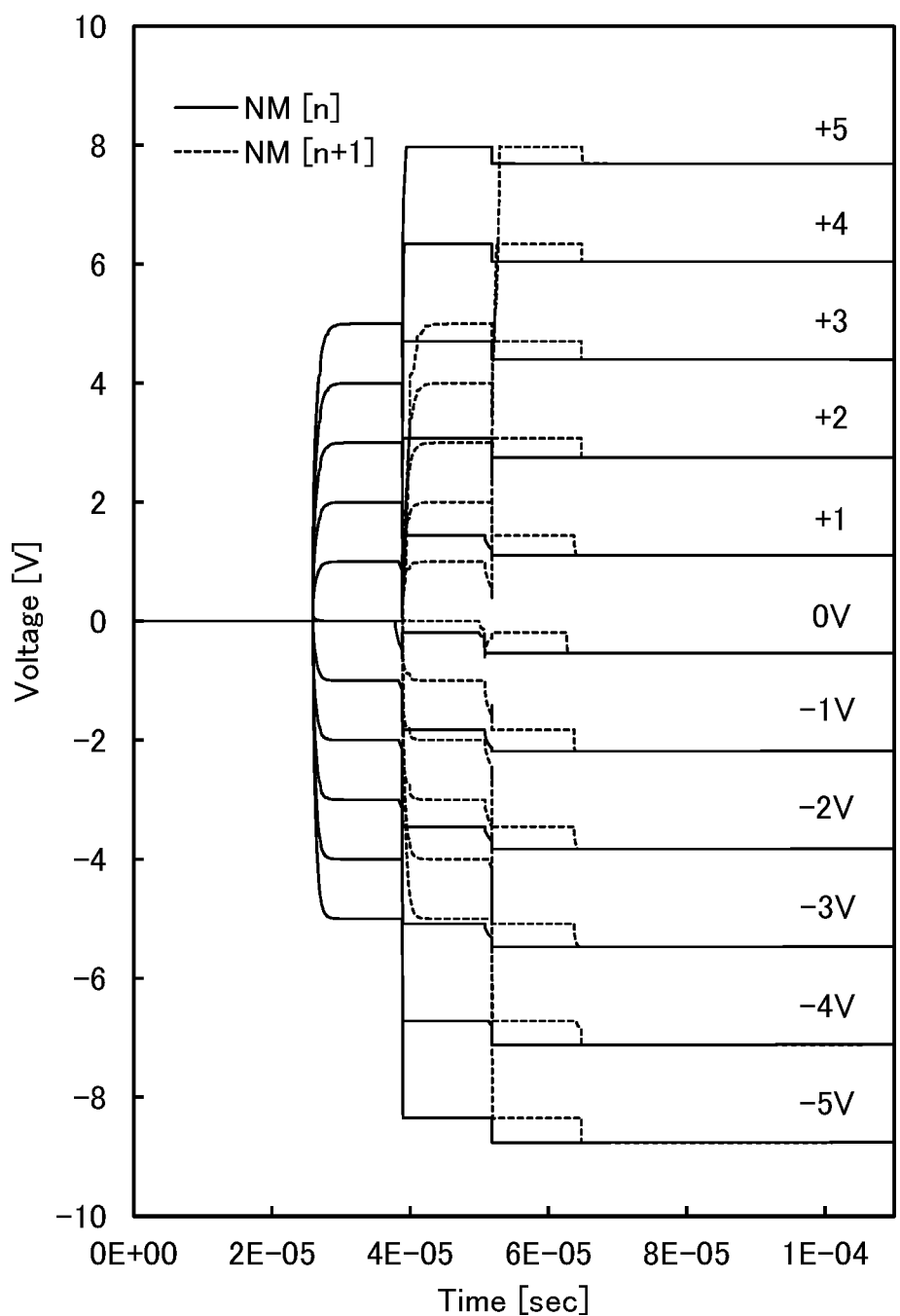
FIG. 11 A diagram showing simulation results.

FIG. 11 shows simulation results of voltages at the node NM[n] and the node NM[n+1] when −5 V to +5 V are input as the image data (DATA). In either cases, it is found that the image data (DATA) is added up in accordance with the capacity ratio between the supplier and the receiver.

From the above simulation results, it is found that the potentials held in the two nodes can be added up and supplied to the display element. The display device of one embodiment of the present invention, in which parallel operation between pixels in a vertical direction is also possible, is preferably used for a display device that requires high-speed operation.

This embodiment can be implemented in combination with any of the structures described in the other embodiments and the like, as appropriate.

Embodiment 2

In this embodiment, a structure example of a display device using a liquid crystal element and a structure example of a display device using an EL element are described. Note that the description of the components, operations, and functions of the display device described in Embodiment 1 is omitted in this embodiment.

Figure 12A:
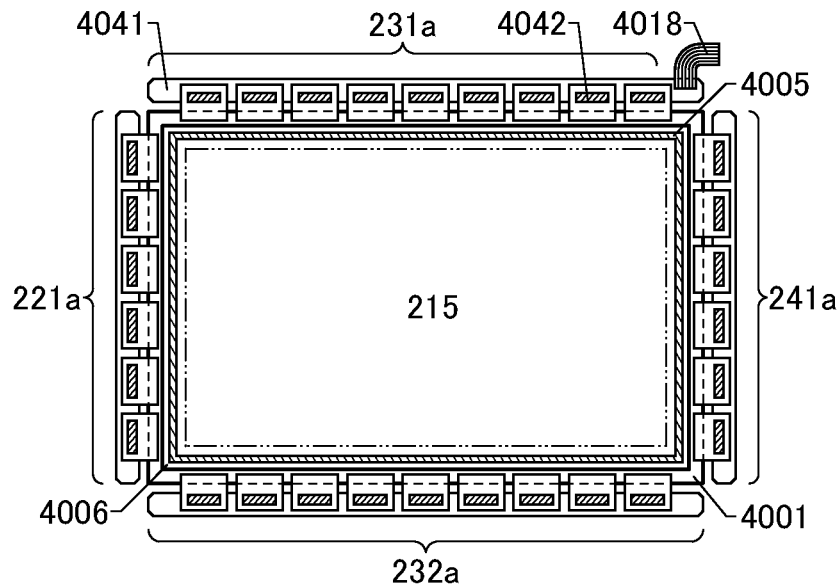
FIGS. 12A to 12C Diagrams each illustrating a display device.
Figure 12B:
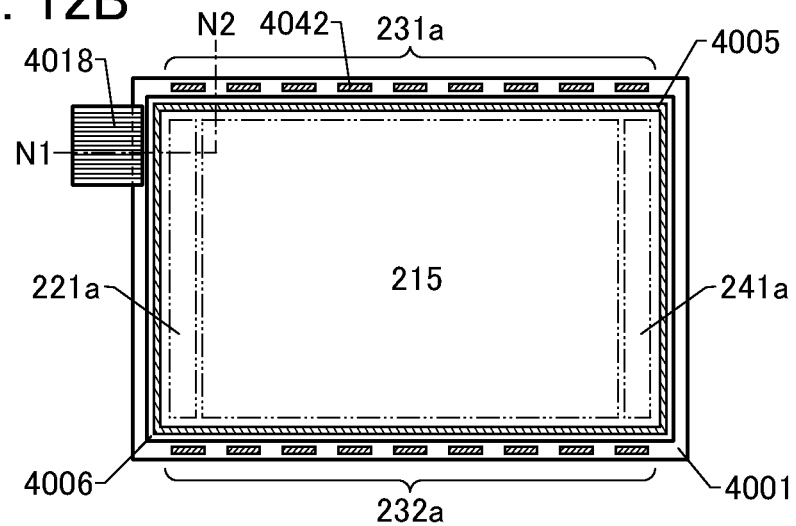
Figure 12C:
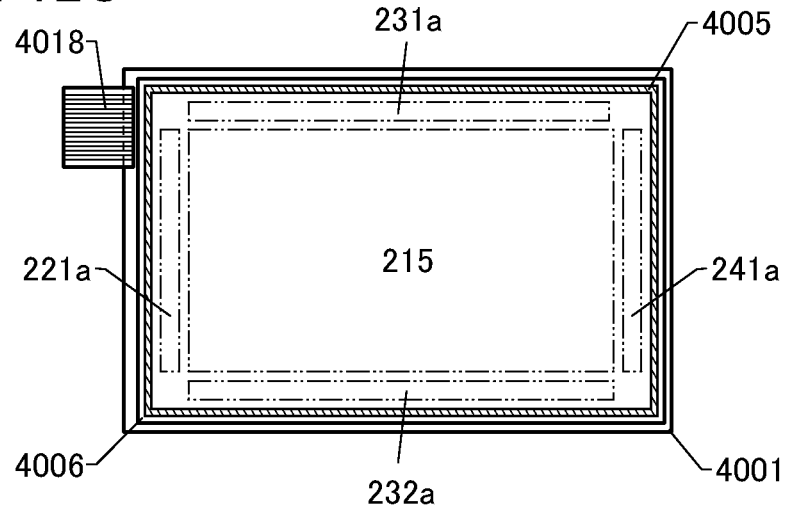

FIG. 12(A) to 12(C) are diagrams each illustrating a structure of a display device in which one embodiment of the present invention can be used.

In FIG. 12(A), a sealant 4005 is provided to surround a display portion 215 provided over a first substrate 4001, and the display portion 215 is sealed with the sealant 4005 and a second substrate 4006.

The pixels 10 and described in Embodiment 1 can be provided in the display portion 215. Note that a scan line driver circuit and a signal line driver circuit which are described below correspond to the gate driver and the source driver, respectively.

In FIG. 12(A), a scan line driver circuit 221a, a signal line driver circuit 231a, a signal line driver circuit 232a, and a common line driver circuit 241a each include a plurality of integrated circuits 4042 provided over a printed circuit board 4041. The integrated circuits 4042 are each formed using a single crystal semiconductor or a polycrystalline semiconductor. The common line driver circuit 241a has a function of supplying a prescribed potential to the wirings 128, 129, 132, 133, and the like described in Embodiment 1.

Signals and potentials are supplied to the scan line driver circuit 221a, the common line driver circuit 241a, the signal line driver circuit 231a, and the signal line driver circuit 232a through an FPC (Flexible printed circuit) 4018.

The integrated circuits 4042 included in the scan line driver circuit 221a and the common line driver circuit 241a each have a function of supplying a selection signal to the display portion 215. The integrated circuits 4042 included in the signal line driver circuit 231a and the signal line driver circuit 232a each have a function of supplying image data to the display portion 215. The integrated circuits 4042 are mounted in a region different from the region surrounded by the sealant 4005 over the first substrate 4001.

Note that the connection method of the integrated circuits 4042 is not particularly limited; a wire bonding method, a COG (Chip On Glass) method, a TCP (Tape Carrier Package) method, a COF (Chip On Film) method, or the like can be used.

FIG. 12(B) shows an example in which the integrated circuits 4042 included in the signal line driver circuit 231a and the signal line driver circuit 232a are mounted by a COG method. Some or all of the driver circuits can be formed over the same substrate as the display portion 215, whereby a system-on-panel can be formed.

In the example shown in FIG. 12(B), the scan line driver circuit 221a and the common line driver circuit 241a are formed over the same substrate as the display portion 215. When the driver circuits are formed concurrently with pixel circuits in the display portion 215, the number of components can be reduced. Accordingly, the productivity can be increased.

In FIG. 12(B), the sealant 4005 is provided to surround the display portion 215, the scan line driver circuit 221a, and the common line driver circuit 241a provided over the first substrate 4001. The second substrate 4006 is provided over the display portion 215, the scan line driver circuit 221a, and the common line driver circuit 241a. Consequently, the display portion 215, the scan line driver circuit 221a, and the common line driver circuit 241a are sealed together with display elements with the use of the first substrate 4001, the sealant 4005, and the second substrate 4006.

Although the signal line driver circuit 231a and the signal line driver circuit 232a are separately formed and mounted on the first substrate 4001 in the example shown in FIG. 12(B), one embodiment of the present invention is not limited to this structure. The scan line driver circuit may be separately formed and then mounted, part of the signal line driver circuits or part of the scan line driver circuits may be separately formed and then mounted. The signal line driver circuit 231a and the signal line driver circuit 232a may be formed over the same substrate as the display portion 215, as shown in FIG. 12(C).

In some cases, the display device encompasses a panel in which the display element is sealed, and a module in which an IC or the like including a controller is mounted on the panel.

The display portion and the scan line driver circuit provided over the first substrate each include a plurality of transistors. As the transistors, the transistor described in the above embodiment can be used.

Transistors included in a peripheral driver circuit and transistors included in the pixel circuits of the display portion may have the same structure or different structures. The transistors included in the peripheral driver circuit may be transistors having the same structure, or transistors having two or more kinds of structures may be included. Similarly, the transistors included in the pixel circuits may be transistors having the same structure, or transistors having two or more kinds of structures may be included.

An input device 4200 can be provided over the second substrate 4006. The display devices illustrated in FIGS. 12(A) to 12(C) and provided with an input device 4200 can function as a touch panel.

There is no particular limitation on a sensor element included in the touch panel of one embodiment of the present invention. A variety of sensors that can sense proximity or touch of a sensing target such as a finger or a stylus can be used as the sensor element.

For example, a variety of types such as a capacitive type, a resistive type, a surface acoustic wave type, an infrared type, an optical type, and a pressure-sensitive type can be used for the sensor.

In this embodiment, a touch panel including a capacitive sensor element is described as an example.

Examples of the capacitive sensor element include a surface capacitive sensor element and a projected capacitive sensor element. Examples of the projected capacitive sensor element include a self-capacitive sensor element and a mutual capacitive sensor element. The use of a mutual capacitive sensor element is preferred because multiple points can be sensed simultaneously.

The touch panel of one embodiment of the present invention can have any of a variety of structures, including a structure in which a display device and a sensor element that are separately formed are attached to each other and a structure in which an electrode and the like included in a sensor element are provided on one or both of a substrate supporting a display element and a counter substrate.

Figure 13A:
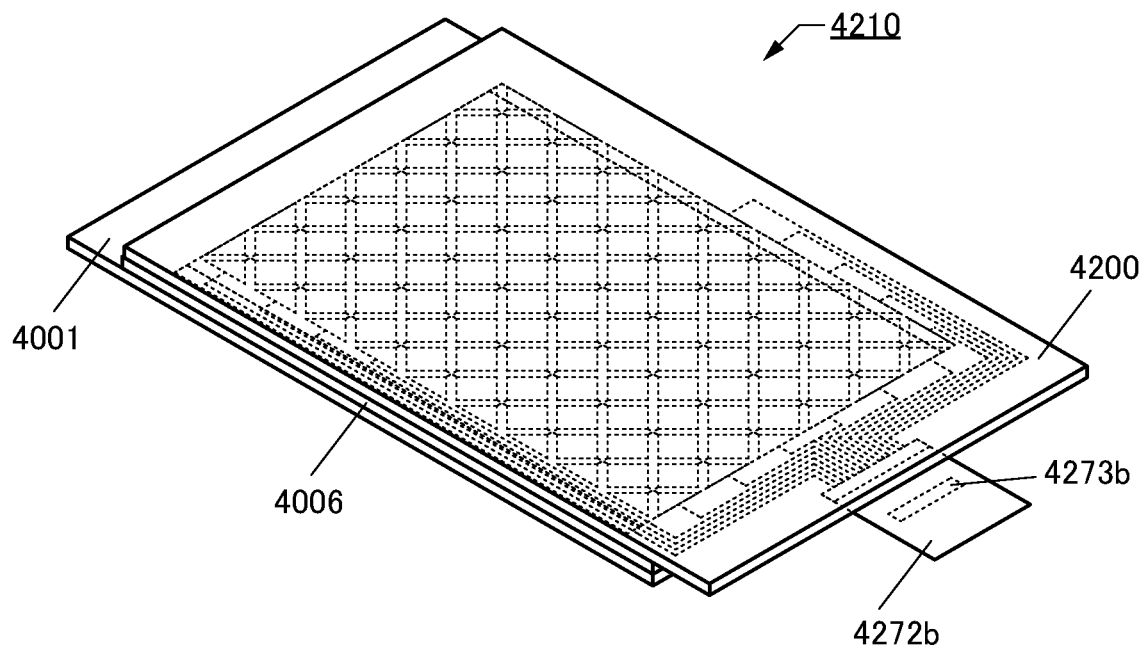
FIGS. 13A and 13B Diagrams each illustrating a touch panel.
Figure 13B:
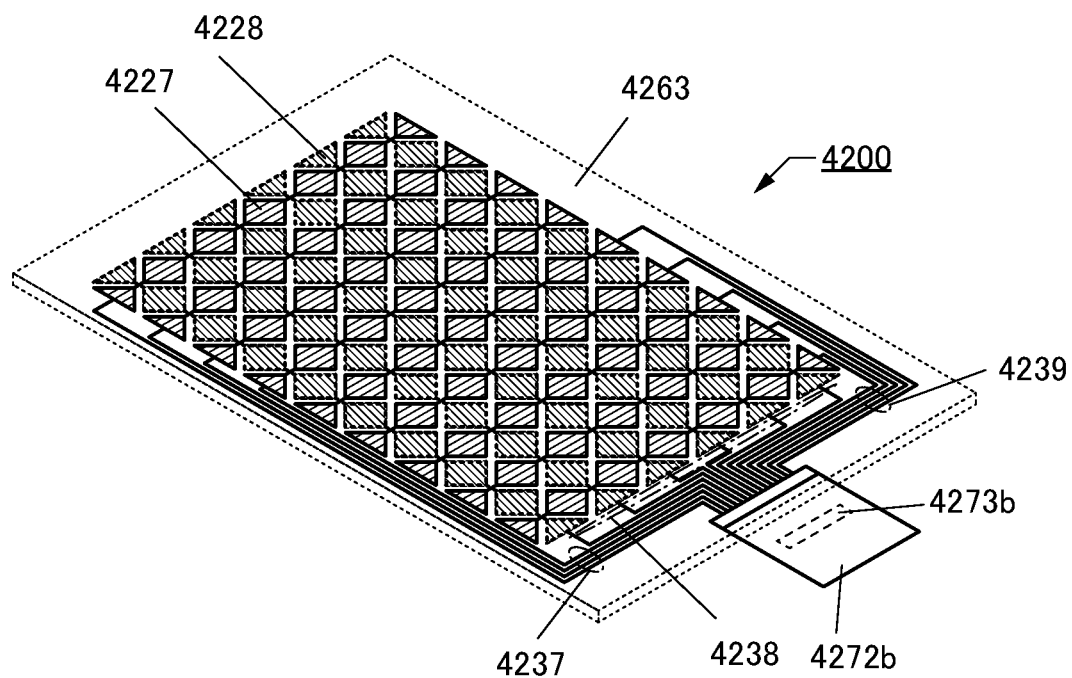

FIGS. 13(A) and 13(B) show an example of the touch panel. FIG. 13(A) is a perspective view of a touch panel 4210. FIG. 13(B) is a schematic perspective view of the input device 4200. Note that for clarity, only typical components are shown.

The touch panel 4210 has a structure in which a display device and a sensor element that are separately formed are attached to each other.

The touch panel 4210 includes the input device 4200 and the display device, which are provided to overlap with each other.

The input device 4200 includes a substrate 4263, an electrode 4227, an electrode 4228, a plurality of wirings 4237, a plurality of wirings 4238, and a plurality of wirings 4239. For example, the electrode 4227 can be electrically connected to the wiring 4237 or the wiring 4239. In addition, the electrode 4228 can be electrically connected to the wiring 4239. An FPC 4272b is electrically connected to each of the plurality of wirings 4237 and the plurality of wirings 4238. An IC 4273b can be provided for the FPC 4272b.

Alternatively, a touch sensor may be provided between the first substrate 4001 and the second substrate 4006 in the display device. In the case where a touch sensor is provided between the first substrate 4001 and the second substrate 4006, either a capacitive touch sensor or an optical touch sensor including a photoelectric conversion element may be used.

FIGS. 14(A) and 14(B) are cross-sectional views of a portion indicated by chain line N1-N2 in FIG. 12(B). Display devices shown in FIGS. 14(A) and 14(B) each include an electrode 4015, and the electrode 4015 is electrically connected to a terminal included in the FPC 4018 through an anisotropic conductive layer 4019. In FIGS. 14(A) and 14(B), the electrode 4015 is electrically connected to a wiring 4014 in an opening formed in an insulating layer 4112, an insulating layer 4111, and an insulating layer 4110.

The electrode 4015 is formed of the same conductive layer as a first electrode layer 4030, and the wiring 4014 is formed of the same conductive layer as source electrodes and drain electrodes of a transistor 4010 and a transistor 4011.

The display portion 215 and the scan line driver circuit 221a provided over the first substrate 4001 each include a plurality of transistors. In FIGS. 14(A) and 14(B), the transistor 4010 included in the display portion 215 and the transistor 4011 included in the scan line driver circuit 221a are shown as an example. Note that in the examples shown in FIGS. 14(A) and 14(B), the transistor 4010 and the transistor 4011 are bottom-gate transistors but may be top-gate transistors.

In FIGS. 14(A) and 14(B), the insulating layer 4112 is provided over the transistor 4010 and the transistor 4011. In FIG. 14(B), a partition wall 4510 is formed over the insulating layer 4112.

The transistor 4010 and the transistor 4011 are provided over an insulating layer 4102. The transistor 4010 and the transistor 4011 each include an electrode 4017 formed over the insulating layer 4111. The electrode 4017 can serve as a back gate electrode.

The display devices shown in FIGS. 14(A) and 14(B) each include a capacitor 4020. The capacitor 4020 includes an electrode 4021 formed in the same step as a gate electrode of the transistor 4010, and an electrode formed in the same step as the source electrode and the drain electrode. The electrodes overlap with each other with an insulating layer 4103 therebetween.

In general, the capacitance of a capacitor provided in a pixel portion of a display device is set in consideration of the leakage current or the like of transistors provided in the pixel portion so that charges can be held for a predetermined period. The capacitance of the capacitor is set in consideration of the off-state current of the transistors or the like.

The transistor 4010 provided in the display portion 215 is electrically connected to the display element. FIG. 14(A) shows an example of a liquid crystal display device using a liquid crystal element as the display element. In FIG. 14(A), a liquid crystal element 4013 serving as the display element includes the first electrode layer 4030, a second electrode layer 4031, and a liquid crystal layer 4008. Note that an insulating layer 4032 and an insulating layer 4033 functioning as alignment films are provided so that the liquid crystal layer 4008 is positioned therebetween. The second electrode layer 4031 is provided on the second substrate 4006 side, and the first electrode layer 4030 and the second electrode layer 4031 overlap with each other with the liquid crystal layer 4008 therebetween.

A spacer 4035 is a columnar spacer obtained by selective etching of an insulating layer and is provided in order to control a distance (a cell gap) between the first electrode layer 4030 and the second electrode layer 4031. Note that a spherical spacer may alternatively be used.

A black matrix (a light-blocking layer); a coloring layer (a color filter); an optical member (an optical substrate) such as a polarizing member, a retardation member, or an anti-reflection member; or the like may be provided as appropriate if needed. For example, circular polarization may be employed by using a polarizing substrate and a retardation substrate. In addition, a backlight, a side light, or the like may be used as a light source. A micro LED or the like may be used as the backlight or the side light.

In the display device shown in FIG. 14(A), a light-blocking layer 4132, a coloring layer 4131, and an insulating layer 4133 are provided between the second substrate 4006 and the second electrode layer 4031.

Examples of a material that can be used for the light-blocking layer include carbon black, titanium black, a metal, a metal oxide, and a composite oxide containing a solid solution of a plurality of metal oxides. The light-blocking layer may be a film containing a resin material or may be a thin film of an inorganic material such as a metal. Stacked films containing the material of the coloring layer can also be used for the light-blocking layer. For example, a stacked-layer structure of a film containing a material of a coloring layer which transmits light of a certain color and a film containing a material of a coloring layer which transmits light of another color can be employed. It is preferable that the coloring layer and the light-blocking layer be formed using the same material because the same manufacturing apparatus can be used and the process can be simplified.

Examples of a material that can be used for the coloring layer include a metal material, a resin material, and a resin material containing a pigment or a dye. The light-blocking layer and the coloring layer can be formed by an inkjet method, for example.

The display devices shown in FIGS. 14(A) and 14(B) each include the insulating layer 4111 and an insulating layer 4104. As the insulating layer 4111 and the insulating layer 4104, insulating layers through which an impurity element does not easily pass are used. A semiconductor layer of the transistor is positioned between the insulating layer 4111 and the insulating layer 4104, whereby entry of impurities from the outside can be prevented.

As the display element included in the display device, a light-emitting element utilizing electroluminescence (EL element) can be used. An EL element includes a layer containing a light-emitting compound (also referred to as an "EL layer") between a pair of electrodes. A potential difference greater than the threshold voltage of the EL element is generated between the pair of electrodes, whereby holes are injected to the EL layer from the anode side and electrons are injected from the cathode side. The injected electrons and holes are recombined in the EL layer and the light-emitting compound contained in the EL layer emits light.

EL elements are classified depending on whether a light-emitting material is an organic compound or an inorganic compound. In general, the former is referred to as an organic EL element, and the latter is referred to as an inorganic EL element. Note that an LED (including a micro LED) that uses a compound semiconductor as a light-emitting material is one of EL elements.

In an organic EL element, by voltage application, electrons are injected from one electrode to the EL layer and holes are injected from the other electrode to the EL layer. The carriers (electrons and holes) are recombined, the light-emitting organic compound forms an excited state, and light is emitted when the excited state returns to a ground state. Owing to such a mechanism, this light-emitting element is referred to as a current-excitation light-emitting element.

Note that in addition to the light-emitting compound, the EL layer may further include a substance with a high hole-injection property, a substance with a high hole-transport property, a hole-blocking material, a substance with a high electron-transport property, a substance with a high electron-injection property, a substance with a bipolar property (a substance with a high electron- and hole-transport property), or the like.

The EL layer can be formed by a method such as an evaporation method (including a vacuum evaporation method), a transfer method, a printing method, an inkjet method, or a coating method.

The inorganic EL elements are classified according to their element structures into a dispersion-type inorganic EL element and a thin-film inorganic EL element. A dispersion-type inorganic EL element includes a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is positioned between dielectric layers, which are further positioned between electrodes, and its light emission mechanism is localization type light emission that utilizes inner-shell electron transition of metal ions. Note that the description is made here using an organic EL element as the light-emitting element.

In order to extract light emitted from the light-emitting element, at least one of the pair of electrodes needs to be transparent. A transistor and a light-emitting element are formed over a substrate. The light-emitting element can have a top emission structure in which light emission is extracted from the surface on the side opposite to the substrate; a bottom emission structure in which light emission is extracted from the surface on the substrate side; or a dual emission structure in which light emission is extracted from both surfaces. The light-emitting element having any of the emission structures can be used.

FIG. 14(B) shows an example of a light-emitting display device using a light-emitting element as a display element (also referred to as an "EL display device"). A light-emitting element 4513 serving as the display element is electrically connected to the transistor 4010 provided in the display portion 215. Note that the structure of the light-emitting element 4513 is a stacked-layer structure of the first electrode layer 4030, a light-emitting layer 4511, and the second electrode layer 4031; however, this embodiment is not limited to this structure. The structure of the light-emitting element 4513 can be changed as appropriate depending on the direction in which light is extracted from the light-emitting element 4513, or the like.

The partition wall 4510 is formed using an organic insulating material or an inorganic insulating material. It is particularly preferable that the partition wall 4510 be formed using a photosensitive resin material to have an opening portion over the first electrode layer 4030 such that a side surface of the opening portion slopes with continuous curvature.

The light-emitting layer 4511 may be formed using a single layer or a plurality of layers stacked.

The emission color of the light-emitting element 4513 can be white, red, green, blue, cyan, magenta, yellow, or the like depending on the material for the light-emitting layer 4511.

As a color display method, there are a method in which the light-emitting element 4513 that emits white light is combined with a coloring layer and a method in which the light-emitting element 4513 that emits light of a different emission color is provided in each pixel. The former method is more productive than the latter method. The latter method, which requires separate formation of the light-emitting layer 4511 pixel by pixel, is less productive than the former method. However, the latter method can provide higher color purity of the emission color than the former method. In the latter method, the color purity can be further increased when the light-emitting element 4513 has a microcavity structure.

Note that the light-emitting layer 4511 may contain an inorganic compound such as quantum dots. For example, when used for the light-emitting layer, the quantum dots can function as a light-emitting material.

A protective layer may be formed over the second electrode layer 4031 and the partition wall 4510 in order to prevent entry of oxygen, hydrogen, moisture, carbon dioxide, or the like into the light-emitting element 4513. For the protective layer, silicon nitride, silicon nitride oxide, aluminum oxide, aluminum nitride, aluminum oxynitride, aluminum nitride oxide, DLC (Diamond Like Carbon), or the like can be used. In a space enclosed by the first substrate 4001, the second substrate 4006, and the sealant 4005, a filler 4514 is provided for sealing. It is preferable that the light-emitting element be packaged (sealed) with a protective film (such as a laminate film or an ultraviolet curable resin film) or a cover member with high air-tightness and little degasification in this manner so that the light-emitting element is not exposed to the outside air.

As the filler 4514, an ultraviolet curable resin or a thermosetting resin can be used as well as an inert gas such as nitrogen or argon; PVC (polyvinyl chloride), an acrylic-based resin, polyimide, an epoxy-based resin, a silicone-based resin, PVB (polyvinyl butyral), EVA (ethylene vinyl acetate), or the like can be used. A drying agent may be contained in the filler 4514.

A glass material such as a glass frit or a resin material such as a curable resin that is curable at room temperature, such as a two-component-mixture-type resin, a light curable resin, or a thermosetting resin can be used for the sealant 4005. A drying agent may be contained in the sealant 4005.

If necessary, an optical film such as a polarizing plate, a circularly polarizing plate (including an elliptically polarizing plate), a retardation plate (a quarter-wave plate or a half-wave plate), or a color filter may be provided as appropriate on an emission surface of the light-emitting element. Furthermore, the polarizing plate or the circularly polarizing plate may be provided with an anti-reflection film. For example, anti-glare treatment by which reflected light can be diffused by projections and depressions on a surface so as to reduce the glare can be performed.

When the light-emitting element has a microcavity structure, light with high color purity can be extracted. Furthermore, when a microcavity structure and a color filter are used in combination, the glare can be reduced and visibility of a display image can be increased.

The first electrode layer and the second electrode layer (also called a pixel electrode layer, a common electrode layer, a counter electrode layer, or the like) for applying voltage to the display element each have a light-transmitting property or a light-reflecting property, which depends on the direction in which light is extracted, the position where the electrode layer is provided, and the pattern structure of the electrode layer.

Each of the first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide, indium tin oxide containing titanium oxide, indium zinc oxide, or indium tin oxide to which silicon oxide is added.

Each of the first electrode layer 4030 and the second electrode layer 4031 can also be formed using one or more kinds selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof and a metal nitride thereof.

A conductive composition containing a conductive high molecule (also referred to as conductive polymer) can be used for the first electrode layer 4030 and the second electrode layer 4031. As the conductive high molecule, a π-electron conjugated conductive high molecule can be used. For example, polyaniline or a derivative thereof, polypyrrole or a derivative thereof, polythiophene or a derivative thereof, and a copolymer of two or more of aniline, pyrrole, and thiophene or a derivative thereof can be given.

Since the transistor is easily broken by static electricity or the like, a protective circuit for protecting the driver circuit is preferably provided. The protective circuit is preferably formed using a nonlinear element.

Figure 15:
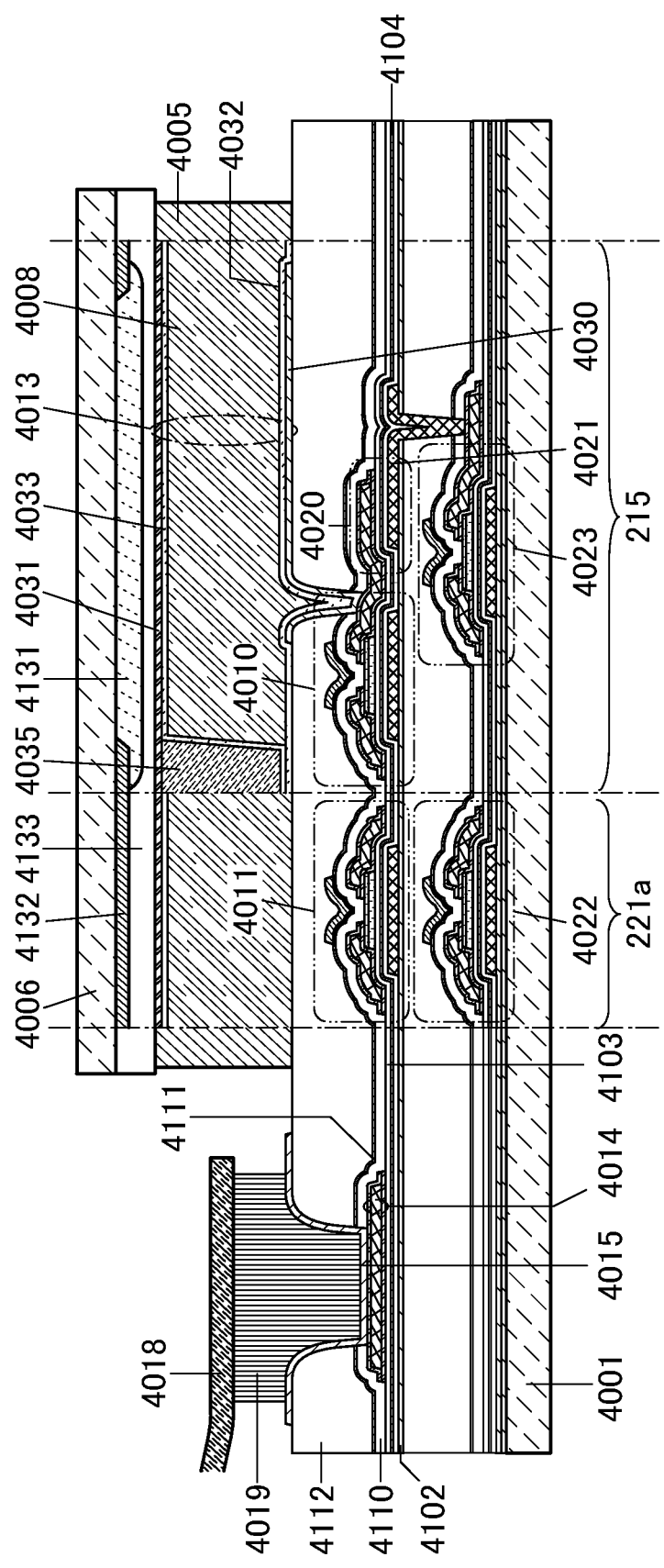
FIG. 15 A diagram illustrating a display device.

Note that as illustrated in FIG. 15, a stacked structure including a region where a transistor and a capacitor overlap with each other in the height direction may be employed. For example, when the transistor 4011 and a transistor 4022 included in the driver circuit are provided to overlap with each other, a display device with a narrow bezel can be provided. Furthermore, when the transistor 4010, a transistor 4023, the capacitor 4020, and the like included in the pixel circuit are provided to at least partly overlap with each other, the aperture ratio and the resolution can be improved. Although an example in which the stacked structure is employed for the liquid crystal display device illustrated in FIG. 14(A) is illustrated in FIG. 15, the stacked structure may be employed for the EL display device illustrated in FIG. 14(B).

In addition, a light-transmitting conductive film with high visible-light-transmitting property is used as an electrode or a wiring in the pixel circuit, whereby transmittance of light in the pixel can be increased and the aperture ratio can be substantially improved. Note that in the case where an OS transistor is used, a semiconductor layer also has a light-transmitting property and thus the aperture ratio can be further increased. These are effective even when transistors and the like are not stacked.

The display device may have a structure with a combination of a liquid crystal display device and a light-emitting device.

The light-emitting device is disposed on the side opposite to the display surface or on an end portion of the display surface. The light-emitting device has a function of supplying light to the display element. The light-emitting device can also be referred to as a backlight.

Here, the light-emitting device can include a plate-like or sheet-like light guide portion (also referred to as a light guide plate) and a plurality of light-emitting elements which emit light of different colors. When the light-emitting elements are disposed in the vicinity of the side surface of the light guide portion, light can be emitted from the side surface of the light guide portion to the inside. The light guide portion has a mechanism that changes an optical path (also referred to as a light extraction mechanism), and this enables the light-emitting device to emit light uniformly to a pixel portion of a display panel. Alternatively, the light-emitting device may be provided directly under the pixel without providing the light guide portion.

The light-emitting device preferably includes light-emitting elements of three colors, red (R), green (G), and blue (B). In addition, a light-emitting element of white (W) may be included. A light emitting diode (LED) is preferably used as these light-emitting elements.

Furthermore, the light-emitting elements preferably have extremely high color purities; the full width at half maximum (FWHM) of the emission spectrum of the light-emitting element is less than or equal to 50 nm, preferably less than or equal to 40 nm, more preferably less than or equal to 30 nm, still more preferably less than or equal to 20 nm. Note that the full width at half maximum of the emission spectrum is preferably as small as possible, and can be, for example, greater than or equal to 1 nm. Thus, when color display is performed, a vivid image with high color reproducibility can be displayed.

As the red light-emitting element, an element whose wavelength of an emission spectrum peak is in a range from 625 nm to 650 nm is preferably used. As the green light-emitting element, an element whose wavelength of an emission spectrum peak is in a range from 515 nm to 540 nm is preferably used. As the blue light-emitting element, an element whose wavelength of an emission spectrum peak is in a range from 445 nm to 470 nm is preferably used.

The display device can make the light-emitting elements for the three colors blink sequentially, drive the pixels in synchronization with these light-emitting elements, and perform color display on the basis of the successive additive color mixing method. This driving method can also be referred to as a field-sequential driving.

By the field-sequential driving, a clear color image can be displayed. In addition, a smooth moving image can be displayed. When the above-described driving method is used, one pixel does not need to be formed with subpixels of different colors, which can make an effective reflection area (also referred to as an effective display area or an aperture ratio) per pixel large; thus, a bright image can be displayed. Furthermore, the pixels do not need to be provided with color filters, and thus can have improved transmittance and achieve brighter image display. In addition, the manufacturing process can be simplified, and the manufacturing costs can be reduced.

FIGS. 16(A) and 16(B) each illustrate an example of a schematic cross-sectional view of a display device capable of the field-sequential driving. A backlight unit capable of emitting light of RGB colors is provided on the substrate 4001 side of the display device. Note that in the field-sequential driving, the RGB colors are expressed through time division light emission, and thus color filters are not needed.

A backlight unit 4340a illustrated in FIG. 16(A) has a structure in which a plurality of light-emitting elements 4342 are provided directly under a pixel with a diffusing plate 4352 positioned therebetween. The diffusing plate 4352 have functions of diffusing light emitted from the light-emitting element 4342 to the substrate 4001 side and making the luminance in a display portion uniform. Between the light-emitting element 4342 and the diffusing plate 4352, a polarizing plate may be provided if necessary. The diffusing plate 4352 is not necessarily provided if not needed. The light-blocking layer 4132 may be omitted.

The backlight unit 4340a can include a large number of light-emitting elements 4342, which enables bright image display. Moreover, there are advantages that a light guide plate is not needed and light efficiency of the light-emitting element 4342 is less likely to be lowered. Note that the light-emitting element 4342 may be provided with a light diffusion lens 4344 if necessary.

A backlight unit 4340b illustrated in FIG. 16(B) has a structure in which a light guide plate 4341 is provided directly under a pixel with the diffusing plate 4352 positioned therebetween. The plurality of light-emitting elements 4342 are provided at an end portion of the light guide plate 4341. The light guide plate 4341 has an uneven shape on the side opposite to the diffusing plate 4352, and can scatter waveguided light with the uneven shape to emit the light in the direction of the diffusing plate 4352.

The light-emitting element 4342 can be fixed to a printed circuit board 4347. Note that in FIG. 16(B), the light-emitting elements 4342 of RGB colors overlap with each other; however, the light-emitting elements 4342 of RGB colors can be arranged to be lined up in the depth direction. A reflective layer 4348 that reflects visible light may be provided on the side surface of the light guide plate 4341 which is opposite to the light-emitting element 4342.

The backlight unit 4340b can reduce the number of light-emitting elements 4342, leading to reductions in cost and thickness.

A light-scattering liquid crystal element may be used as the liquid crystal element. The light-scattering liquid crystal element is preferably an element containing a composite material of liquid crystal and a polymer molecule. For example, a polymer dispersed liquid crystal (PDLC) element can be used. Alternatively, a polymer network liquid crystal (PNLC) element may be used.

The light-scattering liquid crystal element has a structure in which a liquid crystal portion is provided in a three-dimensional network structure of a resin portion sandwiched between a pair of electrodes. As a material used in the liquid crystal portion, for example, a nematic liquid crystal can be used. A photocurable resin can be used for the resin portion. The photocurable resin can be a monofunctional monomer, such as acrylate or methacrylate; a polyfunctional monomer, such as diacrylate, triacrylate, dimethacrylate, or trimethacrylate; or a polymerizable compound obtained by mixing these.

The light-scattering liquid crystal element performs display by transmitting or scattering light utilizing the anisotropy of a refractive index of a liquid crystal material. The resin portion may have the anisotropy of a refractive index. When liquid crystal molecules are arranged in a certain direction in accordance with a voltage applied to the light-scattering liquid crystal element, a direction is generated at which a difference in a refractive index between the liquid crystal portion and the resin portion is small. Incident light along the direction passes without being scattered in the liquid crystal portion. Thus, the light-scattering liquid crystal element is perceived in a transparent state from the direction. In contrast, when liquid crystal molecules are arranged randomly in accordance with the applied voltage, a large difference in refractive index between the liquid crystal portion and the resin portion is not generated, and incident light is scattered in the liquid crystal portion. Thus, the light-scattering liquid crystal element is in an opaque state regardless of the viewing direction.

FIG. 17(A) illustrates a structure in which the liquid crystal element 4013 of the display device illustrated in FIG. 16(A) is replaced with a light-scattering liquid crystal element 4016. The light-scattering liquid crystal element 4016 includes a composite layer 4009 including a liquid crystal portion and a resin portion and electrode layers 4030 and 4031. Although components relating to the field-sequential driving are the same as those in FIG. 16(A), when the light-scattering liquid crystal element 4016 is used, an alignment film and a polarizing plate are not necessary. Note that the spherical spacer 4035 is illustrated, but the spacer 4035 may have a columnar shape.

FIG. 17(B) illustrates a structure in which the liquid crystal element 4013 of the display device illustrated in FIG. 16(B) is replaced with the light-scattering liquid crystal element 4016. In the structure of FIG. 17(B), it is preferable that light be transmitted when a voltage is not applied to the light-scattering liquid crystal element 4016, and light be scattered when a voltage is applied. With such a structure, the display device can be transparent in a normal state (without display). In that case, color display can be performed when light scattering operation is performed.

FIGS. 18(A) to 18(E) illustrate modification examples of the display device in FIG. 17(B). Note that in FIGS. 18(A) to 18(E), some components in FIG. 17(B) are used and the other components are not illustrated for simplicity.

Figure 18A:
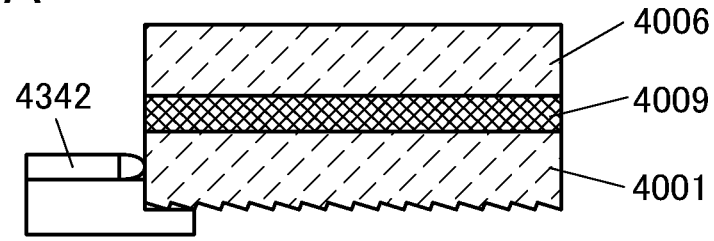
FIGS. 18A to 18E Diagrams each illustrating a display device.

FIG. 18(A) illustrates a structure in which the substrate 4001 has a function of a light guide plate. An uneven surface may be provided on an outer surface of the substrate 4001. With this structure, a light guide plate does not need to be provided additionally, leading to a reduction in a manufacturing cost. Furthermore, the attenuation of light caused by the light guide plate also does not occur; accordingly, light emitted from the light-emitting element 4342 can be efficiently utilized.

Figure 18B:
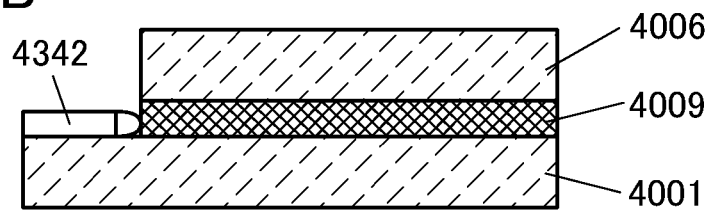

FIG. 18(B) illustrates a structure in which light enters from the vicinity of an end portion of the composite layer 4009. By utilizing total reflection at the interface between the composite layer 4009 and the substrate 4006 and the interface between the composite layer 4009 and the substrate 4001, light can be emitted to the outside from the light-scattering liquid crystal element. For the resin portion of the composite layer 4009, a material having a refractive index higher than that of the substrate 4001 and that of the substrate 4006 is used.

Figure 18C:
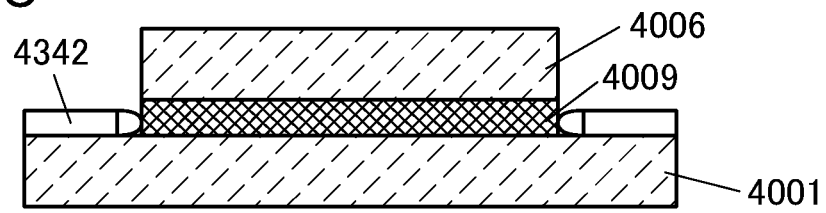

Note that the light-emitting element 4342 is not limited to be provided on one side of the display device, and may be provided on each of two sides facing each other as illustrated in FIG. 18(C). Furthermore, the light-emitting elements 4342 may be provided on three sides or four sides. When the light-emitting elements 4342 are provided on a plurality of sides, attenuation of light can be compensated for and application to a large-area display element is possible.

Figure 18D:
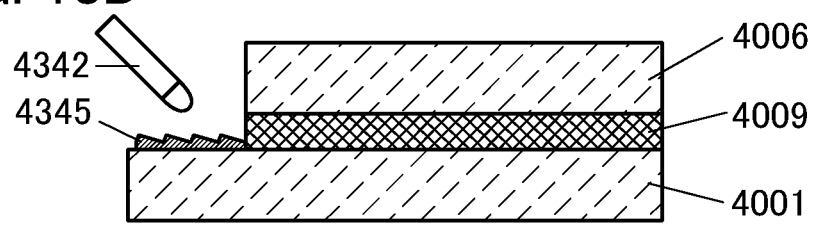

FIG. 18(D) illustrates a structure in which light emitted from the light-emitting element 4342 is guided to the display device through a mirror 4345. With this structure, light can be guided easily with a certain angle to the display device; thus, total reflection light can be obtained efficiently.

Figure 18E:
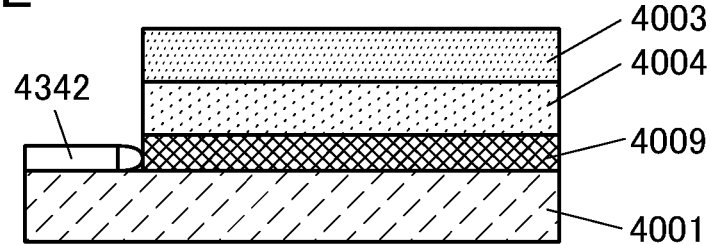

FIG. 18(E) illustrates a structure in which a layer 4003 and a layer 4004 are stacked over the composite layer 4009. One of the layer 4003 and the layer 4004 is a support such as a glass substrate, and the other can be formed of an inorganic film, a coating film of an organic resin, a film, or the like. For the resin portion of the composite layer 4009, a material having a refractive index higher than that of the layer 4004 is used. For the layer 4004, a material having a refractive index higher than that of the layer 4003 is used.

A first interface is formed between the composite layer 4009 and the layer 4004, and a second interface is formed between the layer 4004 and the layer 4003. With this structure, light passing through without being totally reflected at the first interface is totally reflected at the second interface and can be returned to the composite layer 4009. Accordingly, light emitted from the light-emitting element 4342 can be efficiently utilized.

Note that the structures in FIG. 17(B) and FIGS. 18(A) to 18(E) can be combined with each other.

This embodiment can be implemented in combination with any of the structures described in the other embodiments and the like, as appropriate.

Embodiment 3

In this embodiment, examples of transistors which can be used as the transistors described in the above embodiments are described with reference to drawings.

The display device of one embodiment of the present invention can be fabricated using a transistor with any of various structures, such as a bottom-gate transistor or a top-gate transistor. Therefore, a material of a semiconductor layer or the structure of a transistor can be easily changed depending on the existing production line.

[Bottom-Gate Transistor]

FIG. 19(A1) is a cross-sectional view of a channel-protective transistor 810, which is a type of bottom-gate transistor, in the channel length direction. In FIG. 19(A1), the transistor 810 is formed over a substrate 771. The transistor 810 includes an electrode 746 over the substrate 771 with an insulating layer 772 therebetween. The transistor 810 also includes a semiconductor layer 742 over the electrode 746 with an insulating layer 726 therebetween. The electrode 746 can function as a gate electrode. The insulating layer 726 can function as a gate insulating layer.

The transistor 810 includes an insulating layer 741 over a channel formation region in the semiconductor layer 742. The transistor 810 also includes an electrode 744a and an electrode 744b which are over the insulating layer 726 and partly in contact with the semiconductor layer 742. The electrode 744a can function as one of a source electrode and a drain electrode. The electrode 744b can function as the other of the source electrode and the drain electrode. Part of the electrode 744a and part of the electrode 744b are formed over the insulating layer 741.

The insulating layer 741 can function as a channel protective layer. With the insulating layer 741 provided over the channel formation region, the semiconductor layer 742 can be prevented from being exposed at the time of forming the electrode 744a and the electrode 744b. Thus, the channel formation region in the semiconductor layer 742 can be prevented from being etched at the time of forming the electrode 744a and the electrode 744b. According to one embodiment of the present invention, a transistor with favorable electrical characteristics can be provided.

The transistor 810 includes an insulating layer 728 over the electrode 744a, the electrode 744b, and the insulating layer 741 and also includes an insulating layer 729 over the insulating layer 728.

In the case where an oxide semiconductor is used for the semiconductor layer 742, a material capable of removing oxygen from part of the semiconductor layer 742 to generate oxygen vacancies is preferably used at least for portions of the electrode 744a and the electrode 744b which are in contact with the semiconductor layer 742. The carrier concentration in the regions of the semiconductor layer 742 where oxygen vacancies are generated is increased, so that the regions become n-type regions ($n^+$ layers). Accordingly, the regions can function as a source region and a drain region. When an oxide semiconductor is used for the semiconductor layer 742, examples of the material capable of removing oxygen from the semiconductor layer 742 to generate oxygen vacancies include tungsten and titanium.

Formation of the source region and the drain region in the semiconductor layer 742 makes it possible to reduce contact resistance between the semiconductor layer 742 and each of the electrode 744a and the electrode 744b. Accordingly, the electrical characteristics of the transistor, such as the field-effect mobility and the threshold voltage, can be improved.

In the case where a semiconductor such as silicon is used for the semiconductor layer 742, a layer that functions as an n-type semiconductor or a p-type semiconductor is preferably provided between the semiconductor layer 742 and the electrode 744a and between the semiconductor layer 742 and the electrode 744b. The layer that functions as an n-type semiconductor or a p-type semiconductor can function as the source region or the drain region in the transistor.

The insulating layer 729 is preferably formed using a material that has a function of preventing or reducing diffusion of impurities into the transistor from the outside. Note that the insulating layer 729 can be omitted as necessary.

A transistor 811 shown in FIG. 19(A2) is different from the transistor 810 in that an electrode 723 that can function as a back gate electrode is provided over the insulating layer 729. The electrode 723 can be formed using a material and a method similar to those for the electrode 746.

In general, a back gate electrode is formed using a conductive layer and positioned so that a channel formation region in a semiconductor layer is positioned between the gate electrode and the back gate electrode. Thus, the back gate electrode can function in a manner similar to that of the gate electrode. The potential of the back gate electrode may be the same as the potential of the gate electrode or may be a ground potential (GND potential) or an arbitrary potential. When the potential of the back gate electrode is changed independently of the potential of the gate electrode, the threshold voltage of the transistor can be changed.

The electrode 746 and the electrode 723 can each function as a gate electrode. Thus, the insulating layer 726, the insulating layer 728, and the insulating layer 729 can each function as a gate insulating layer. Note that the electrode 723 may be provided between the insulating layer 728 and the insulating layer 729.

Note that in the case where one of the electrode 746 and the electrode 723 is referred to as a "gate electrode", the other is referred to as a "back gate electrode". For example, in the transistor 811, in the case where the electrode 723 is referred to as a "gate electrode", the electrode 746 is referred to as a "back gate electrode". In the case where the electrode 723 is used as a "gate electrode", the transistor 811 can be regarded as a kind of top-gate transistor. One of the electrode 746 and the electrode 723 may be referred to as a "first gate electrode", and the other may be referred to as a "second gate electrode".

By providing the electrode 746 and the electrode 723 with the semiconductor layer 742 therebetween and setting the potential of the electrode 746 equal to the potential of the electrode 723, a region of the semiconductor layer 742 through which carriers flow is enlarged in the film thickness direction; thus, the number of transferred carriers is increased. As a result, the on-state current of the transistor 811 is increased and the field-effect mobility is increased.

Therefore, the transistor 811 is a transistor having high on-state current for its occupation area. That is, the occupation area of the transistor 811 can be small for required on-state current. According to one embodiment of the present invention, the occupation area of a transistor can be reduced. Therefore, according to one embodiment of the present invention, a semiconductor device having a high degree of integration can be provided.

The gate electrode and the back gate electrode are formed using conductive layers and thus each have a function of preventing an electric field generated outside the transistor from affecting the semiconductor layer in which the channel is formed (in particular, an electric field blocking function against static electricity and the like). Note that when the back gate electrode is formed larger than the semiconductor layer such that the semiconductor layer is covered with the back gate electrode, the electric field blocking function can be enhanced.

When the back gate electrode is formed using a light-blocking conductive film, light can be prevented from entering the semiconductor layer from the back gate electrode side. Therefore, photodegradation of the semiconductor layer can be prevented, and deterioration in electrical characteristics of the transistor, such as a shift of the threshold voltage, can be prevented.

According to one embodiment of the present invention, a transistor with favorable reliability can be provided. Moreover, a semiconductor device with favorable reliability can be provided.

FIG. 19(B1) is a cross-sectional view of a channel-protective transistor 820, which has a structure different from FIG. 19(A1), in the channel length direction. The transistor 820 has substantially the same structure as the transistor 810 but is different from the transistor 810 in that the insulating layer 741 covers end portions of the semiconductor layer 742. The semiconductor layer 742 is electrically connected to the electrode 744a through an opening portion formed by selectively removing part of the insulating layer 741 that overlaps with the semiconductor layer 742. The semiconductor layer 742 is electrically connected to the electrode 744b through another opening portion formed by selectively removing part of the insulating layer 741 that overlaps with the semiconductor layer 742. A region of the insulating layer 741 that overlaps with the channel formation region can function as a channel protective layer.

A transistor 821 shown in FIG. 19(B2) is different from the transistor 820 in that the electrode 723 that can function as a back gate electrode is provided over the insulating layer 729.

With the insulating layer 741, the semiconductor layer 742 can be prevented from being exposed at the time of forming the electrode 744a and the electrode 744b. Thus, the semiconductor layer 742 can be prevented from being reduced in thickness at the time of forming the electrode 744a and the electrode 744b.

The distance between the electrode 744a and the electrode 746 and the distance between the electrode 744b and the electrode 746 are longer in the transistor 820 and the transistor 821 than in the transistor 810 and the transistor 811. Thus, the parasitic capacitance generated between the electrode 744a and the electrode 746 can be reduced. Moreover, the parasitic capacitance generated between the electrode 744b and the electrode 746 can be reduced. According to one embodiment of the present invention, a transistor with favorable electrical characteristics can be provided.

FIG. 19(C1) is a cross-sectional view of a channel-etched transistor 825, which is a type of bottom-gate transistor, in the channel length direction. In the transistor 825, the electrode 744a and the electrode 744b are formed without the insulating layer 741. Thus, part of the semiconductor layer 742 that is exposed at the time of forming the electrode 744a and the electrode 744b might be etched. However, since the insulating layer 729 is not provided, the productivity of the transistor can be increased.

A transistor 826 shown in FIG. 10(C2) is different from the transistor 825 in that the electrode 723 that can function as a back gate electrode is provided over the insulating layer 729.

FIGS. 20(A1) to (C2) are cross-sectional views of the transistors 810, 811, 820, 821, 825, and 826 in the channel width direction, respectively.

In each of the structures shown in FIGS. 20(B2) and FIG. 20(C2), the gate electrode is connected to the back gate electrode, and the gate electrode and the back gate electrode have the same potential. In addition, the semiconductor layer 742 is positioned between the gate electrode and the back gate electrode.

The length of each of the gate electrode and the back gate electrode in the channel width direction is longer than the length of the semiconductor layer 742 in the channel width direction. In the channel width direction, the whole of the semiconductor layer 742 is covered with the gate electrode and the back gate electrode with the insulating layers 726, 741, 728, and 729 positioned therebetween.

In this structure, the semiconductor layer 742 included in the transistor can be electrically surrounded by electric fields of the gate electrode and the back gate electrode.

The transistor device structure in which the semiconductor layer 742 in which the channel formation region is formed is electrically surrounded by electric fields of the gate electrode and the back gate electrode, as in the transistor 821 or the transistor 826, can be referred to as a Surrounded channel (S-channel) structure.

With the S-channel structure, an electric field for inducing a channel can be effectively applied to the semiconductor layer 742 by one or both of the gate electrode and the back gate electrode, which improves the current drive capability of the transistor and offers high on-state current characteristics. In addition, the transistor can be miniaturized because the on-state current can be increased. The S-channel structure can also increase the mechanical strength of the transistor.

[Top-Gate Transistor]

A transistor 842 shown in FIG. 21(A1) is a type of top-gate transistor. The electrode 744a and the electrode 744b are electrically connected to the semiconductor layer 742 through opening portions formed in the insulating layer 728 and the insulating layer 729.

Part of the insulating layer 726 that does not overlap with the electrode 746 is removed, and an impurity is introduced into the semiconductor layer 742 using the electrode 746 and the remaining insulating layer 726 as masks, so that an impurity region can be formed in the semiconductor layer 742 in a self-aligned manner. The transistor 842 includes a region where the insulating layer 726 extends beyond end portions of the electrode 746. The semiconductor layer 742 in a region into which the impurity is introduced through the insulating layer 726 has a lower impurity concentration than the semiconductor layer 742 in a region into which the impurity is introduced not through the insulating layer 726. Thus, an LDD (Lightly Doped Drain) region is formed in the region of the semiconductor layer 742 that does not overlap with the electrode 746.

A transistor 843 shown in FIG. 21(A2) is different from the transistor 842 in that the electrode 723 is included. The transistor 843 includes the electrode 723 that is formed over the substrate 771. The electrode 723 includes a region overlapping with the semiconductor layer 742 with the insulating layer 772 therebetween. The electrode 723 can function as a back gate electrode.

As in a transistor 844 shown in FIG. 21(B1) and a transistor 845 shown in FIG. 21(B2), the insulating layer 726 in a region that does not overlap with the electrode 746 may be completely removed. Alternatively, as in a transistor 846 shown in FIG. 21(C1) and a transistor 847 shown in FIG. 21(C2), the insulating layer 726 may be left.

Also in the transistor 842 to the transistor 847, after the formation of the electrode 746, the impurity is introduced into the semiconductor layer 742 using the electrode 746 as a mask, so that an impurity region can be formed in the semiconductor layer 742 in a self-aligned manner. According to one embodiment of the present invention, a transistor with favorable electrical characteristics can be provided.

Furthermore, according to one embodiment of the present invention, a semiconductor device having a high degree of integration can be provided.

FIGS. 22(A1) to 22(C2) are cross-sectional views of the transistors 842, 843, 844, 845, 846, and 847 in the channel width direction, respectively.

The transistor 843, the transistor 845, and the transistor 847 each have the above-described S-channel structure. However, one embodiment of the present invention is not limited to this, and the transistor 843, the transistor 845, and the transistor 847 do not necessarily have the S-channel structure.

This embodiment can be implemented in combination with any of the structures described in the other embodiments and the like, as appropriate.

Embodiment 4

Examples of an electronic device that can use the display device of one embodiment of the present invention include display devices, personal computers, image storage devices or image reproducing devices provided with storage media, cellular phones, game machines including portable game machines, portable data terminals, e-book readers, cameras such as video cameras and digital still cameras, goggle-type displays (head mounted displays), navigation systems, audio reproducing devices (e.g., car audio players and digital audio players), copiers, facsimiles, printers, multifunction printers, automated teller machines (ATM), and vending machines. FIG. 23 show specific examples of such electronic devices.

Figure 23A:
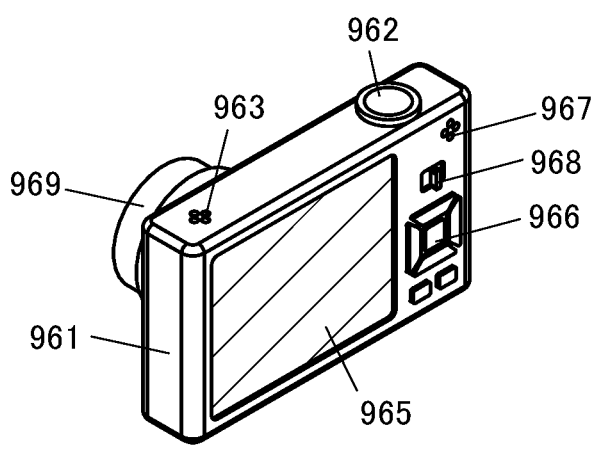
FIGS. 23A to 23F Diagrams each illustrating an electronic device.

FIG. 23(A) shows a digital camera, which includes a housing 961, a shutter button 962, a microphone 963, a speaker 967, a display portion 965, operation keys 966, a zoom lever 968, a lens 969, and the like. The use of the display device of one embodiment of the present invention for the display portion 965 enables display of a variety of images.

Figure 23B:
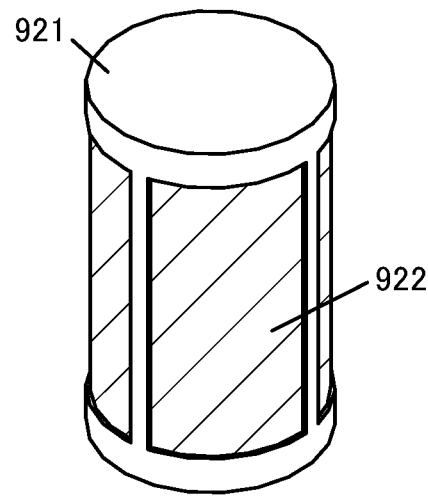

FIG. 23(B) shows a digital signage, which has large display portions 922. The digital signage can be installed on the side surface of a pillar 921, for example. The use of the display device of one embodiment of the present invention for the display portion 922 enables display with high display quality.

Figure 23C:
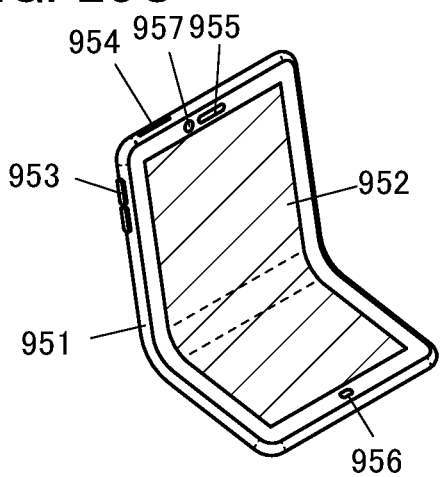

FIG. 23(C) shows an example of a cellular phone, which includes a housing 951, a display portion 952, an operation button 953, an external connection port 954, a speaker 955, a microphone 956, a camera 957, and the like. The display portion 952 of the cellular phone includes a touch sensor. Operations such as making a call and inputting text can be performed by touch on the display portion 952 with a finger, a stylus, or the like. The housing 951 and the display portion 952 have flexibility and can be used in a bent state as shown in the figure. The use of the display device of one embodiment of the present invention for the display portion 952 enables display of a variety of images.

Figure 23D:
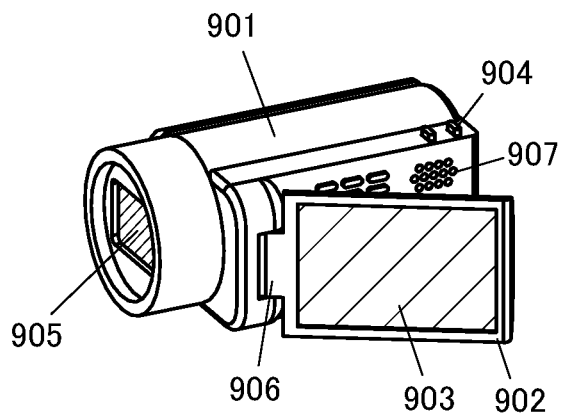

FIG. 23(D) is a video camera, which includes a first housing 901, a second housing 902, a display portion 903, an operation key 904, a lens 905, a connection portion 906, a speaker 907, and the like. The operation key 904 and the lens 905 are provided on the first housing 901, and the display portion 903 is provided on the second housing 902. The use of the display device of one embodiment of the present invention for the display portion 903 enables display of a variety of images.

Figure 23E:
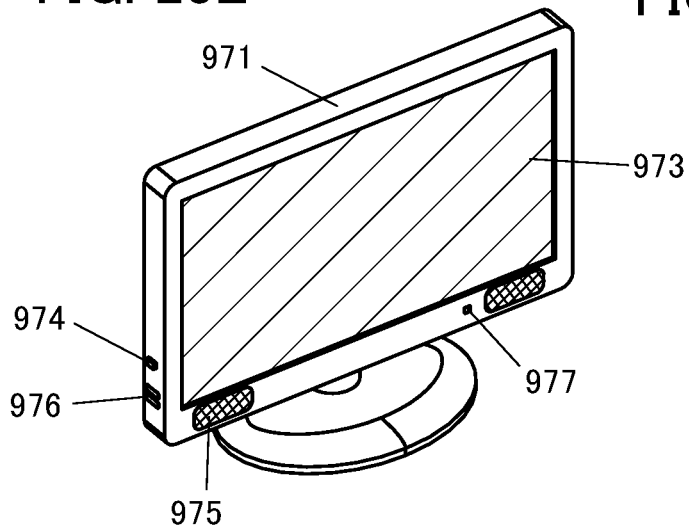

FIG. 23(E) shows a television, which includes a housing 971, a display portion 973, an operation key 974, speakers 975, a communication connection terminal 976, an optical sensor 977, and the like. The display portion 973 includes a touch sensor that enables input operation. The use of the display device of one embodiment of the present invention for the display portion 973 enables display of a variety of images.

Figure 23F:
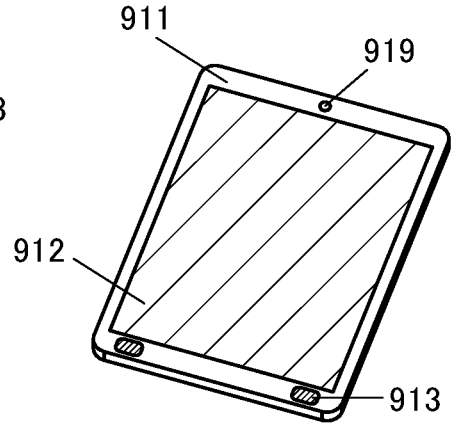

FIG. 23(F) shows a portable data terminal, which includes a housing 911, a display portion 912, speakers 913, a camera 919, and the like. A touch panel function of the display portion 912 enables input and output of information. The use of the display device of one embodiment of the present invention for the display portion 912 enables display of a variety of images.

This embodiment can be implemented in combination with any of the structures described in the other embodiments and the like, as appropriate.

REFERENCE NUMERALS

10: pixel, 11: display element, 12: source driver, 13: gate driver, 101: transistor, 102: transistor, 103: transistor, 104: transistor, 105: capacitor, 106: capacitor, 110: circuit block, 111: transistor, 112: transistor, 113: capacitor, 114: EL element, 115: transistor, 116: capacitor, 117: liquid crystal element, 118: transistor, 119: transistor, 120: circuit, 121: wiring, 125: wiring, 126: wiring, 127: wiring, 128: wiring, 129: wiring, 130: wiring, 131: wiring, 132: wiring, 133: wiring, 134: wiring, 136: connection line, 215: display portion, 221a: scan line driver circuit, 231a: signal line driver circuit, 232a: signal line driver circuit, 241a: common line driver circuit, 723: electrode, 726: insulating layer, 728: insulating layer, 729: insulating layer, 741: insulating layer, 742: semiconductor layer, 744a: electrode, 744b: electrode, 746: electrode, 771: substrate, 772: insulating layer, 810: transistor, 811: transistor, 820: transistor, 821: transistor, 825: transistor, 826: transistor, 830: transistor, 840: transistor, 842: transistor, 843: transistor, 844: transistor, 845: transistor, 846: transistor, 847: transistor, 901: housing, 902: housing, 903: display portion, 904: operation key, 905: lens, 906: connection portion, 907: speaker, 911: housing, 912: display portion, 913: speaker, 919: camera, 921: pillar, 922: display portion, 951: housing, 952: display portion, 953: operation button, 954: external connection port, 955: speaker, 956: microphone, 957: camera, 961: housing, 962: shutter button, 963: microphone, 965: display portion, 966: operation key, 967: speaker, 968: zoom lever, 969: lens, 971: housing, 973: display portion, 974: operation key, 975: speaker, 976: communication connection terminal, 977: optical sensor, 4001: substrate, 4003: layer, 4004: layer, 4005: sealant, 4006: substrate, 4008: liquid crystal layer, 4009: composite layer, 4010: transistor, 4011: transistor, 4013: liquid crystal element, 4014: wiring, 4015: electrode, 4016: light-scattering liquid crystal element, 4017: electrode, 4018: FPC, 4019: anisotropic conductive layer, 4020: capacitor, 4021: electrode, 4022: transistor, 4023: transistor, 4030: electrode layer, 4031: electrode layer, 4032: insulating layer, 4033: insulating layer, 4035: spacer, 4041: printed circuit board, 4042: integrated circuit, 4102: insulating layer, 4103: insulating layer, 4104: insulating layer, 4110: insulating layer, 4111: insulating layer, 4112: insulating layer, 4131: coloring layer, 4132: light-blocking layer, 4133: insulating layer, 4200: input device, 4210: touch panel, 4227: electrode, 4228: electrode, 4237: wiring, 4238: wiring, 4239: wiring, 4263: substrate, 4272b: FPC, 4273b: IC, 4340a: backlight unit, 4340b: backlight unit, 4341: light guide plate, 4342: light-emitting element, 4344: lens, 4345: mirror, 4347: printed circuit board, 4348: reflective layer, 4352: diffusing plate, 4510: partition wall, 4511: light-emitting layer, 4513: light-emitting element, 4514: filler

The invention claimed is:

1. A display device comprising:
a first pixel and a second pixel, the first pixel and the second pixel each comprising:
  a first transistor, a second transistor, a third transistor, a fourth transistor, a first capacitor, a second capacitor, and a circuit block comprising a display element,
  wherein one of a source and a drain of the first transistor is electrically connected to one electrode of the first capacitor,
  wherein the one electrode of the first capacitor is electrically connected to one of a source and a drain of the second transistor,
  wherein the other of the source and the drain of the second transistor is electrically connected to one of a source and a drain of the third transistor,
  wherein the one of the source and the drain of the third transistor is electrically connected to one electrode of the second capacitor,
  wherein the other electrode of the second capacitor is electrically connected to one of a source and a drain of the fourth transistor,
  wherein the one of the source and the drain of the fourth transistor is electrically connected to the display element,
  wherein, in the first pixel,
  the other of the source and the drain of the first transistor is electrically connected to a first wiring;
  the other of the source and the drain of the fourth transistor is electrically connected to the first wiring;
  a gate of the first transistor is electrically connected to a second wiring;
  a gate of the second transistor is electrically connected to a third wiring;
  a gate of the third transistor is electrically connected to the second wiring; and
  a gate of the fourth transistor is electrically connected to the second wiring,
  wherein, in the second pixel:
  the other of the source and the drain of the first transistor is electrically connected to the first wiring;
  the other of the source and the drain of the fourth transistor is electrically connected to the first wiring;
  a gate of the first transistor is electrically connected to the third wiring;
  a gate of the second transistor is electrically connected to a fourth wiring;
  a gate of the third transistor is electrically connected to the third wiring; and
  a gate of the fourth transistor is electrically connected to the third wiring.

2. The display device according to claim 1, wherein the fourth transistor comprises an oxide semiconductor in a channel formation region.

3. The display device according to claim 2, wherein the gate of the second transistor of the first pixel and the gate of the fourth transistor of the second pixel have the same potential as each other.

4. The display device according to claim 2,
  wherein the circuit block further comprises a fifth transistor, a sixth transistor, a third capacitor,
  wherein the display element is an organic EL element,
  wherein one electrode of the display element is electrically connected to one of a source and a drain of the sixth transistor,
  wherein the other of the source and the drain of the sixth transistor is electrically connected to one electrode of the third capacitor,
  wherein the one electrode of the third capacitor is electrically connected to one of a source and a drain of the fifth transistor,
  wherein a gate of the fifth transistor is electrically connected to the other electrode of the third capacitor, and
  wherein the other electrode of the third capacitor is electrically connected to the other electrode of the second capacitor.

5. The display device according to claim 4, wherein the other of the source and the drain of the fifth transistor is electrically connected to the other of the source and the drain of the third transistor.

6. The display device according to claim 2,
  wherein the circuit block further comprises a fifth transistor, a third capacitor,
  wherein the display element is a liquid crystal element,
  wherein one electrode of the display element is electrically connected to one electrode of the third capacitor,
  wherein the one electrode of the third capacitor is electrically connected to one of a source and a drain of the fifth transistor, and
  wherein the other of the source and the drain of the fifth transistor is electrically connected to the other electrode of the second capacitor.

7. The display device according to claim 6, wherein the other electrode of the third capacitor is electrically connected to the other of the source and the drain of the third transistor.

8. The display device according to claim 2,
  wherein the oxide semiconductor is a metal oxide, and
  wherein the metal oxide comprises In and Zn, and
  wherein the metal oxide further comprises any one of Al, Ti, Ga, Ge, Sn, Y, Zr, La, Ce, Nd and Hf.

9. An electronic device comprising:
  the display device according to claim 2; and
  a camera.

* * * * *